(12) United States Patent
Kikitsu et al.

(10) Patent No.: US 11,726,149 B2
(45) Date of Patent: Aug. 15, 2023

(54) MAGNETIC SENSOR AND INSPECTION DEVICE

(71) Applicant: KABUSHIKI KAISHA TOSHIBA, Tokyo (JP)

(72) Inventors: Akira Kikitsu, Yokohama Kanagawa (JP); Satoshi Shirotori, Yokohama Kanagawa (JP); Yoshihiro Higashi, Komatsu Ishikawa (JP); Yoshinari Kurosaki, Kawasaki Kanagawa (JP); Hitoshi Iwasaki, Nerima Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 106 days.

(21) Appl. No.: 17/405,920

(22) Filed: Aug. 18, 2021

(65) Prior Publication Data

US 2022/0221536 A1 Jul. 14, 2022

(30) Foreign Application Priority Data

Jan. 13, 2021 (JP) .................................. 2021-003368

(51) Int. Cl.
*G01R 33/09* (2006.01)
*G01R 33/00* (2006.01)

(52) U.S. Cl.
CPC ........ *G01R 33/093* (2013.01); *G01R 33/0011* (2013.01); *G01R 33/0023* (2013.01)

(58) Field of Classification Search
CPC .............. G01R 33/093; G01R 33/0011; G01R 33/0023
See application file for complete search history.

(56) References Cited

U.S. PATENT DOCUMENTS

| 11,513,173 B2* | 11/2022 | Kikitsu | G01R 33/091 |
| 2009/0015252 A1* | 1/2009 | Raberg | H01L 27/22 324/252 |
| 2016/0163431 A1* | 6/2016 | Zhou | H01C 7/13 338/32 R |
| 2017/0363606 A1 | 12/2017 | Kikitsu et al. | |
| 2018/0271395 A1 | 9/2018 | Iwasaki et al. | |
| 2019/0369172 A1 | 12/2019 | Kikitsu et al. | |

FOREIGN PATENT DOCUMENTS

| JP | 2018-155719 A | 10/2018 |
| JP | 2019-207167 A | 12/2019 |
| JP | 6668176 B2 | 3/2020 |

* cited by examiner

*Primary Examiner* — Reena Aurora
(74) *Attorney, Agent, or Firm* — Finnegan, Henderson, Farabow, Garrett & Dunner, LLP

(57) ABSTRACT

According to one embodiment, a magnetic sensor includes a base body including a base body end portion, a magnetic member, and an element part. A direction from the base body toward the magnetic member is along a first direction. The element part includes first and second magnetic elements. An orientation from the first magnetic element toward the second magnetic element is along a second direction crossing the first direction. A portion of the first magnetic element and a portion of the second magnetic element are between the base body and the magnetic member. A position in a third direction of an other portion of the first magnetic element and a position in the third direction of an other portion of the second magnetic element are between a position in the third direction of the base body end portion and a position in the third direction of the magnetic member.

20 Claims, 19 Drawing Sheets

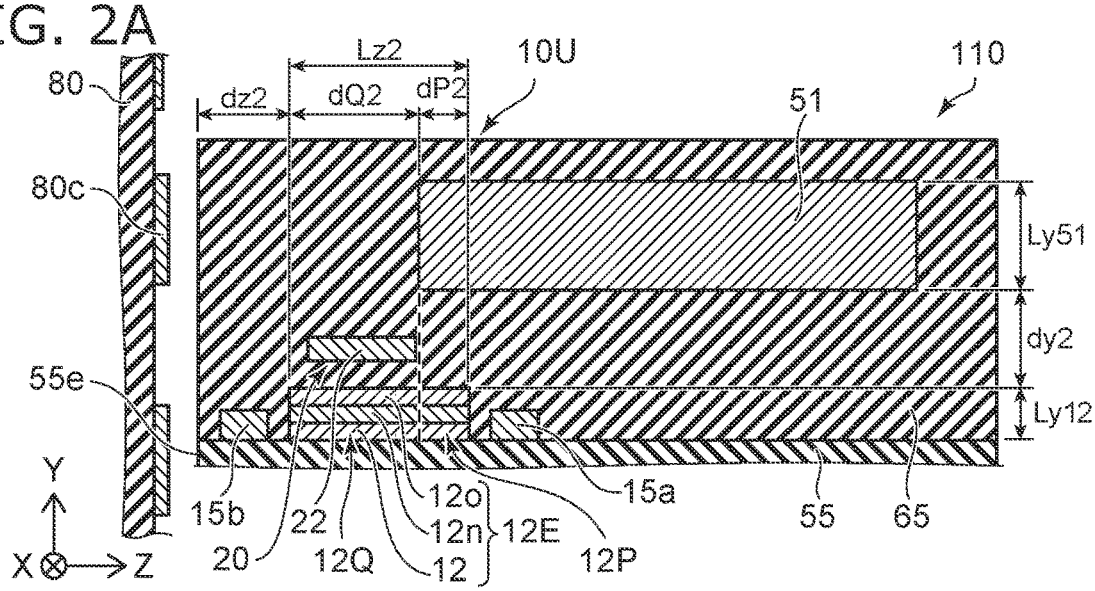
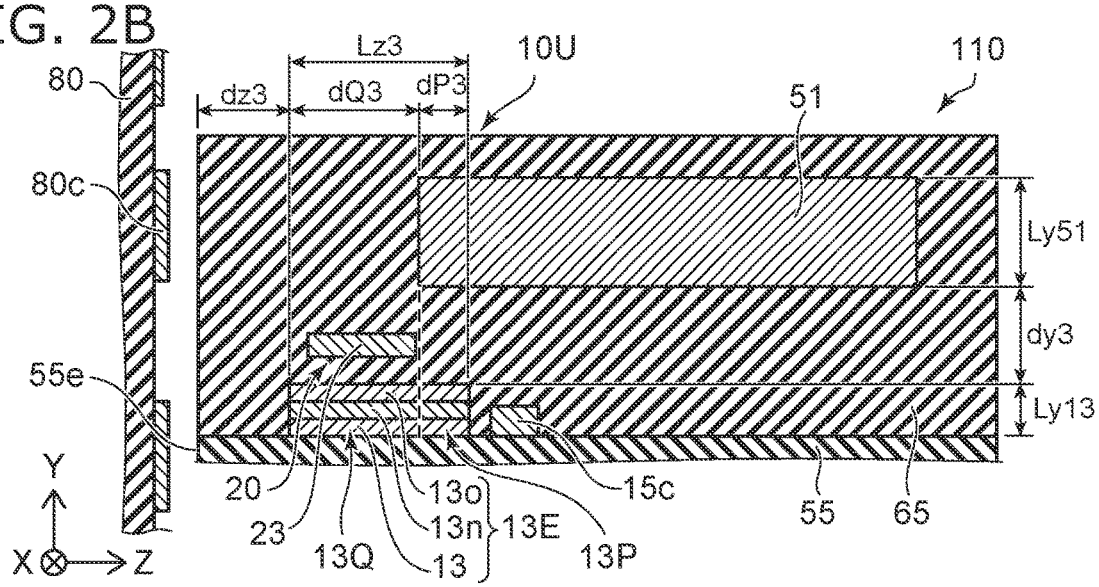
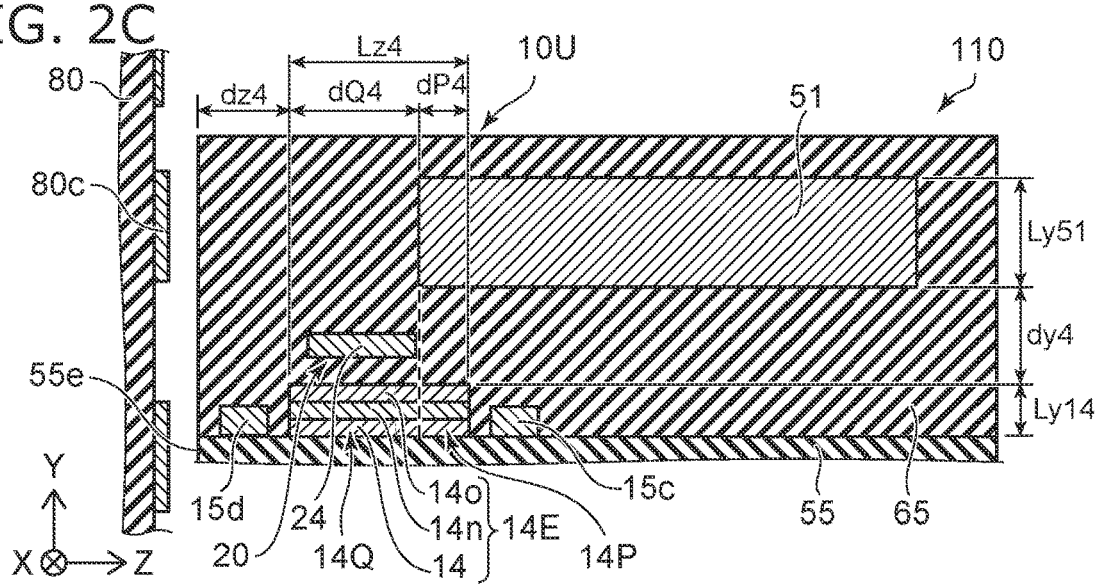

Hsig=0

+Hsig

-Hsig

MAGNETIC SENSOR AND INSPECTION DEVICE

CROSS-REFERENCE TO RELATED APPLICATIONS

This application is based upon and claims the benefit of priority from Japanese Patent Application No. 2021-003368, filed on Jan. 13, 2021; the entire contents of which are incorporated herein by reference.

FIELD

Embodiments described herein relate generally to a magnetic sensor and an inspection device.

BACKGROUND

There is a magnetic sensor that uses a magnetic layer. There is an inspection device that uses the magnetic sensor. It is desirable to improve the characteristics of the magnetic sensor.

BRIEF DESCRIPTION OF THE DRAWINGS

FIGS. 2A to 2C are schematic cross-sectional views illustrating the magnetic sensor according to the first embodiment;

DETAILED DESCRIPTION

Figure 1A:
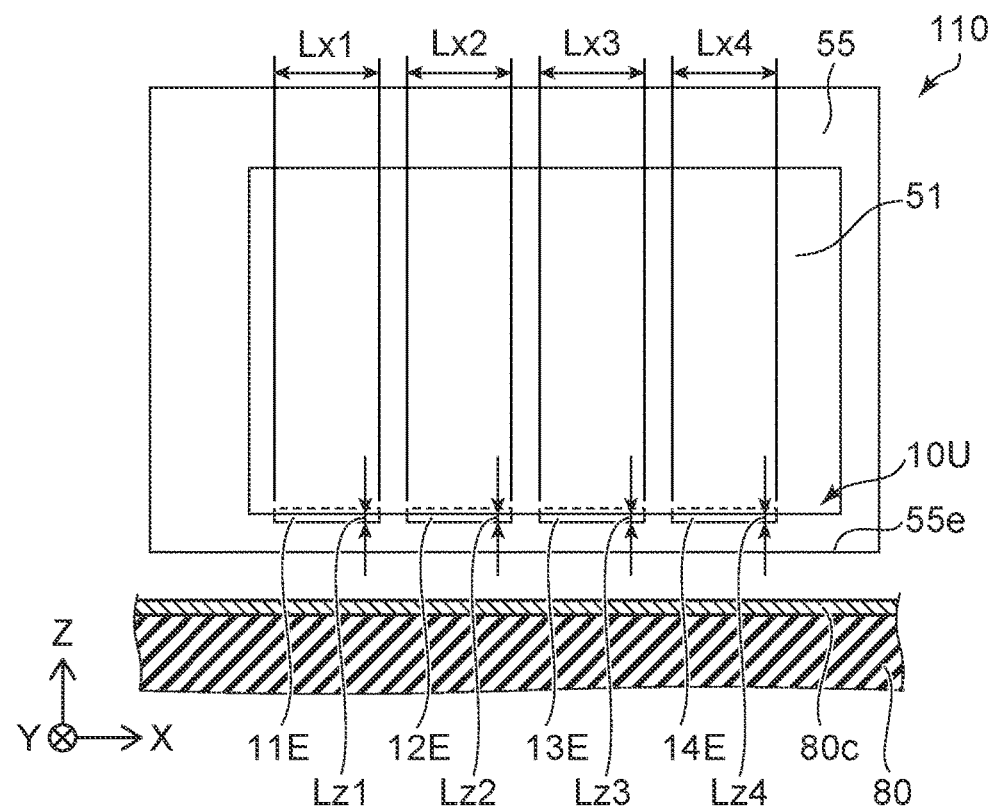
FIGS. 1A and 1B are schematic views illustrating a magnetic sensor according to a first embodiment.

According to one embodiment, a magnetic sensor includes a base body including a base body end portion, a magnetic member, and an element part. A direction from the base body toward the magnetic member is along a first direction. The element part includes a first magnetic element and a second magnetic element. An orientation from the first magnetic element toward the second magnetic element is along a second direction crossing the first direction. A portion of the first magnetic element and a portion of the second magnetic element are between the base body and the magnetic member in the first direction. A position in a third direction of an other portion of the first magnetic element and a position in the third direction of an other portion of the second magnetic element are between a position in the third direction of the base body end portion and a position in the third direction of the magnetic member. The third direction crosses a plane including the first and second directions.

According to one embodiment, an inspection device includes the magnetic sensor described above, and a processor configured to process a signal output from the magnetic sensor.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1B:
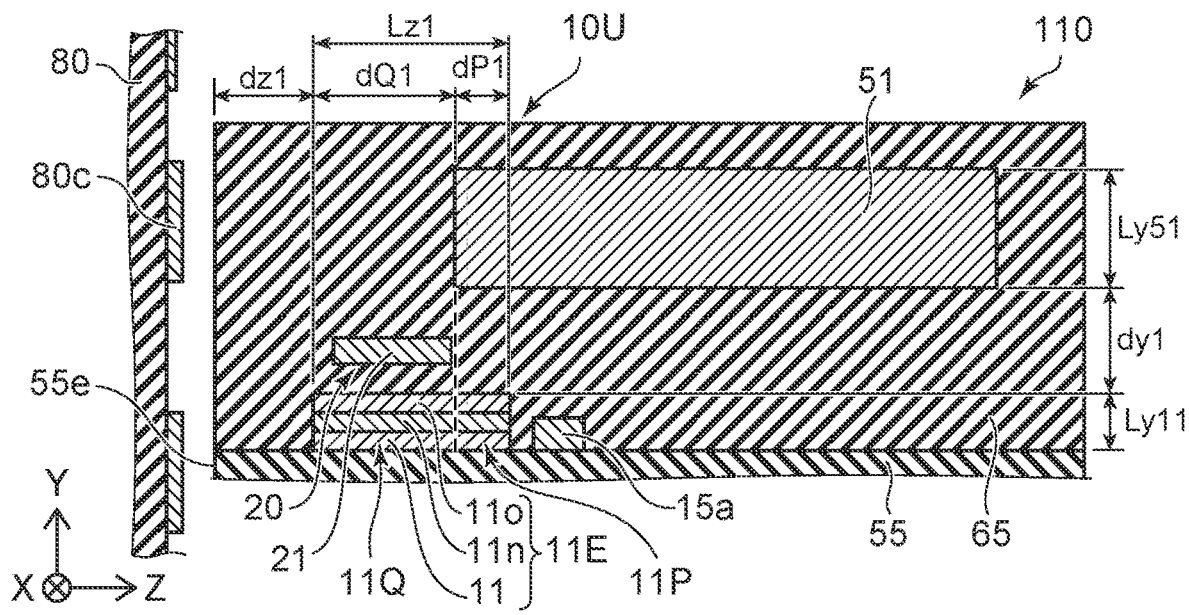

FIGS. 1A and 1B are schematic views illustrating a magnetic sensor according to a first embodiment.

FIG. 1A is a plan view. FIG. 1B is a cross-sectional view.

FIGS. 2A to 2C are schematic cross-sectional views illustrating the magnetic sensor according to the first embodiment.

As shown in FIGS. 1A and 1B, the magnetic sensor 110 according to the embodiment includes a base body 55, a magnetic member 51, and an element part 10U.

The base body 55 includes a base body end portion 55e. The direction from the base body 55 toward the magnetic member 51 is along a first direction. The first direction is taken as a Y-axis direction. One direction perpendicular to the Y-axis direction is taken as an X-axis direction. A direction perpendicular to the Y-axis direction and the X-axis direction is taken as a Z-axis direction.

The element part 10U includes a first magnetic element 11E and a second magnetic element 12E. In the example, the element part 10U further includes a third magnetic element 13E and a fourth magnetic element 14E.

The orientation from the first magnetic element 11E toward the second magnetic element 12E is along a second direction. The second direction crosses the first direction (the Y-axis direction). The second direction is, for example, the X-axis direction. For example, the orientation from the first magnetic element 11E toward the third magnetic element 13E is along the second direction. The orientation from the first magnetic element 11E toward the fourth magnetic element 14E is along the second direction. For example, the multiple magnetic elements are arranged along the X-axis direction. The sequence of the arrangement of the multiple magnetic elements is arbitrary.

As shown in FIG. 1A, the base body end portion 55e extends along the second direction (e.g., the X-axis direction). For example, the multiple magnetic elements are arranged along the base body end portion 55e. For example, distances dz1 to dz4 between the base body end portion 55e and each of the multiple magnetic elements (referring to FIG. 1B and FIGS. 2A to 2C) may be substantially the same.

FIG. 1B is a cross-sectional view of the Y-Z plane that includes the first magnetic element 11E. FIG. 2A is a cross-sectional view of the Y-Z plane that includes the second magnetic element 12E. FIG. 2B is a cross-sectional view of the Y-Z plane that includes the third magnetic element 13E. FIG. 2C is a cross-sectional view of the Y-Z plane that includes the fourth magnetic element 14E.

As shown in FIGS. 1B and 2B, a portion 11P of the first magnetic element 11E and a portion 12P of the second magnetic element 12E are between the base body 55 and the magnetic member 51 in the first direction (the Y-axis direction). The portion 11P of the first magnetic element 11E and the portion 12P of the second magnetic element 12E overlap the magnetic member 51 in the first direction (the Y-axis direction). Another portion 11Q of the first magnetic element 11E and another portion 12Q of the second magnetic element 12E do not overlap the magnetic member 51 in the first direction (the Y-axis direction).

As shown in FIGS. 2B and 2C, a portion 13P of the third magnetic element 13E and a portion 14P of the fourth magnetic element 14E are between the base body 55 and the magnetic member 51 in the first direction (the Y-axis direction). The portion 13P of the third magnetic element 13E and the portion 14P of the fourth magnetic element 14E overlap the magnetic member 51 in the first direction (the Y-axis direction). Another portion 13Q of the third magnetic element 13E and another portion 14Q of the fourth magnetic element 14E do not overlap the magnetic member 51 in the first direction (the Y-axis direction).

A direction that crosses a plane (the Y-X plane) including the first and second directions is taken as a third direction. The third direction is, for example, the Z-axis direction.

As shown in FIG. 1B, for example, the position in the third direction (the Z-axis direction) of the other portion 11Q of the first magnetic element 11E is between the position in the third direction of the base body end portion 55e and the position in the third direction of the magnetic member 51.

As shown in FIG. 2A, for example, the position in the third direction (the Z-axis direction) of the other portion 12Q of the second magnetic element 12E is between the position in the third direction of the base body end portion 55e and the position in the third direction of the magnetic member 51.

As shown in FIG. 2B, for example, the position in the third direction (the Z-axis direction) of the other portion 13Q of the third magnetic element 13E is between the position in the third direction of the base body end portion 55e and the position in the third direction of the magnetic member 51.

As shown in FIG. 2C, for example, the position in the third direction (the Z-axis direction) of the other portion 14Q of the fourth magnetic element 14E is between the position in the third direction of the base body end portion 55e and the position in the third direction of the magnetic member 51.

Thus, a portion of each of the multiple magnetic elements overlaps the magnetic member 51; and another portion of each of the multiple magnetic elements does not overlap the magnetic member 51.

As shown in FIGS. 1A and 1B, the magnetic sensor 110 is configured to face a detection object 80. The detection object 80 is, for example, the inspection object. The detection object 80 includes, for example, a local magnetic field source. The detection object 80 includes, for example, at least an inspection conductive member 80c such as a metal, etc. For example, the magnetic sensor 110 is configured to detect a magnetic field (a current magnetic field) caused by a current that flows in the inspection conductive member 80c.

For example, the magnetic flux of the current magnetic field is concentrated by the magnetic member 51. The magnetic flux that is concentrated by the magnetic member 51 is efficiently applied to the element part 10U (the multiple magnetic elements). For example, the magnetic member 51 functions as a MFC (Magnetic Flux Concentrator).

As shown in FIG. 1B, the first magnetic element 11E includes a first magnetic layer 11, a first counter magnetic layer 11o, and a first nonmagnetic layer 11n. The first nonmagnetic layer 11n is located between the first magnetic layer 11 and the first counter magnetic layer 11o.

As shown in FIG. 2A, the second magnetic element 12E includes a second magnetic layer 12, a second counter magnetic layer 12o, and a second nonmagnetic layer 12n. The second nonmagnetic layer 12n is located between the second magnetic layer 12 and the second counter magnetic layer 12o.

As shown in FIG. 2B, the third magnetic element 13E includes a third magnetic layer 13, a third counter magnetic layer 13o, and a third nonmagnetic layer 13n. The third nonmagnetic layer 13n is located between the third magnetic layer 13 and the third counter magnetic layer 13o.

As shown in FIG. 2C, the fourth magnetic element 14E includes a fourth magnetic layer 14, a fourth counter magnetic layer 14o, and a fourth nonmagnetic layer 14n. The fourth nonmagnetic layer 14n is located between the fourth magnetic layer 14 and the fourth counter magnetic layer 14o.

The first to fourth magnetic layers 11 to 14 and the first to fourth counter magnetic layers 11o to 14o include at least one selected from the group consisting of Fe, Co, and Ni. These magnetic layers are, for example, ferromagnetic layers. The first to fourth nonmagnetic layers 11n to 14n include, for example, a conductive material such as Cu, etc. The first to fourth magnetic elements 11E to 14E are, for example, GMR (Giant Magneto Resistance) elements. The first to fourth magnetic elements 11E to 14E may be, for example, TMR (Tunnel Magneto Resistance) elements.

For example, the electrical resistances of the first to fourth magnetic elements 11E to 14E change according to the magnetic field from the detection object 80. For example, in each of these magnetic elements, the orientation of the magnetization of at least one of the magnetic layer or the counter magnetic layer changes according to the magnetic field. The angle between the magnetization of the magnetic layer and the magnetization of the counter magnetic layer changes due to the change of the orientation of the magnetization. The electrical resistances of the first to fourth magnetic elements 11E to 14E change according to the changes of the angles. The magnetic field from the detection object 80 is detected by detecting the change of the electrical resistance.

According to the embodiment, the magnetic field from the detection object 80 is concentrated by the magnetic member 51; and the concentrated magnetic field is applied to the first to fourth magnetic elements 11E to 14E. A portion of each of the multiple magnetic elements overlaps the magnetic member 51; and another portion of each of the multiple magnetic elements does not overlap the magnetic member 51; thereby, the magnetic field is more efficiently applied to the magnetic elements. Higher sensitivity is obtained thereby. A magnetic sensor with improved sensing characteristics can be provided.

As shown in FIG. 1B, the length along the third direction (the Z-axis direction) of the portion 11P of the first magnetic element 11E is taken as a length dP1. The length along the third direction of the first magnetic element 11E is taken as a length Lz1. According to the embodiment, it is favorable for the length dP1 to be not more than 0.5 times the length Lz1. The length Lz1 is the sum of the length dP1 and a length dQ1 along the Z-axis direction of the other portion 11Q of the first magnetic element 11E. For example, the length dP1 may be not less than 0.001 times the length Lz1. As described below, it is more favorable for the ratio of the length dP1 to the length Lz1 to be not more than 0.4 times.

As shown in FIG. 2A, the length along the third direction (the Z-axis direction) of the portion 12P of the second magnetic element 12E is taken as a length dP2. The length along the third direction of the second magnetic element 12E is taken as a length Lz2. According to the embodiment, it is favorable for the length dP2 to be not more than 0.5 times the length Lz2. The length Lz2 is the sum of the length dP2 and a length dQ2 along the Z-axis direction of the other portion 12Q of the second magnetic element 12E. For example, the length dP2 may be not less than 0.001 times the length Lz2.

As shown in FIG. 2B, the length along the third direction (the Z-axis direction) of the portion 13P of the third magnetic element 13E is taken as a length dP3. The length along the third direction of the third magnetic element 13E is taken as a length Lz3. According to the embodiment, it is favorable for the length dP3 to be not more than 0.5 times the length Lz3. The length Lz3 is the sum of the length dP3 and a length dQ3 along the Z-axis direction of the other portion 13Q of the third magnetic element 13E. For example, the length dP3 may be not less than 0.001 times the length Lz3.

As shown in FIG. 2C, the length along the third direction (the Z-axis direction) of the portion 14P of the fourth magnetic element 14E is taken as a length dP4. The length along the third direction of the fourth magnetic element 14E is taken as a length Lz4. According to the embodiment, it is favorable for the length dP4 to be not more than 0.5 times the length Lz4. The length Lz4 is the sum of the length dP4 and a length dQ4 along the Z-axis direction of the other portion 14Q of the fourth magnetic element 14E. For example, the length dP4 may be not less than 0.001 times the length Lz4. Examples of the relationships between the characteristics and the lengths described above are described below.

As shown in FIG. 1B, the distance along the third direction (the Z-axis direction) between the base body end portion 55e and the first magnetic element 11E is taken as the distance dz1. For example, it is favorable for the distance dz1 to be not less than 0.1 times and not more than 100 times the length Lz1 along the third direction of the first magnetic element 11E.

As shown in FIG. 2A, the distance along the third direction (the Z-axis direction) between the base body end portion 55e and the second magnetic element 12E is taken as the distance dz2. For example, it is favorable for the distance dz2 to be not less than 0.1 times and not more than 100 times the length Lz2 along the third direction of the second magnetic element 12E.

As shown in FIG. 2B, the distance along the third direction (the Z-axis direction) between the base body end portion 55e and the third magnetic element 13E is taken as the distance dz3. For example, it is favorable for the distance dz3 to be not less than 0.1 times and not more than 100 times the length Lz3 along the third direction of the third magnetic element 13E.

As shown in FIG. 2C, the distance along the third direction (the Z-axis direction) between the base body end portion 55e and the fourth magnetic element 14E is taken as the distance dz4. For example, it is favorable for the distance dz4 to be not less than 0.1 times and not more than 100 times the length Lz4 along the third direction of the fourth magnetic element 14E.

Because all the distances dz1, dz2, dz3 and dz4 are short, the distances between the detection object 80 and the multiple magnetic elements can be short. The magnetic field from the detection object 80 can be effectively applied to the multiple magnetic elements before it spread out to the air. For example, the spatial resolution of the detection can be increased. A magnetic sensor with improved sensing characteristics can be provided.

An example of simulation results of the characteristics of the magnetic sensor will now be described. A simulation when one magnetic element (the first magnetic element 11E) is included will now be described.

The model of the simulation includes a conducting wire that is used as the inspection conductive member 80c. The distance along the Y-axis direction between the conducting wire and the first magnetic element 11E is 20 μm. In the simulation, the distribution of the magnetic field generated by a current flow in the conducting wire was calculated using a finite element method. The average value of the magnetic flux density inside the first magnetic element 11E was evaluated as an index of the magnitude of the convergence of the magnetic flux due to the magnetic member 51.

The characteristics were calculated in advance for the case when the position in the Y-axis direction of the conducting wire is changed. In the calculation, it was found that spatial resolution of detecting the current magnetic field generated by the conducting wire was the same between the case when the magnetic member 51 is included and the case when the magnetic member 51 is not included. When the magnetic member 51 is included, compared to when the magnetic member 51 is not included, more magnetic flux can be converged while maintaining the spatial resolution. The sensitivity can be increased when the magnetic member 51 is included.

Figure 3A:
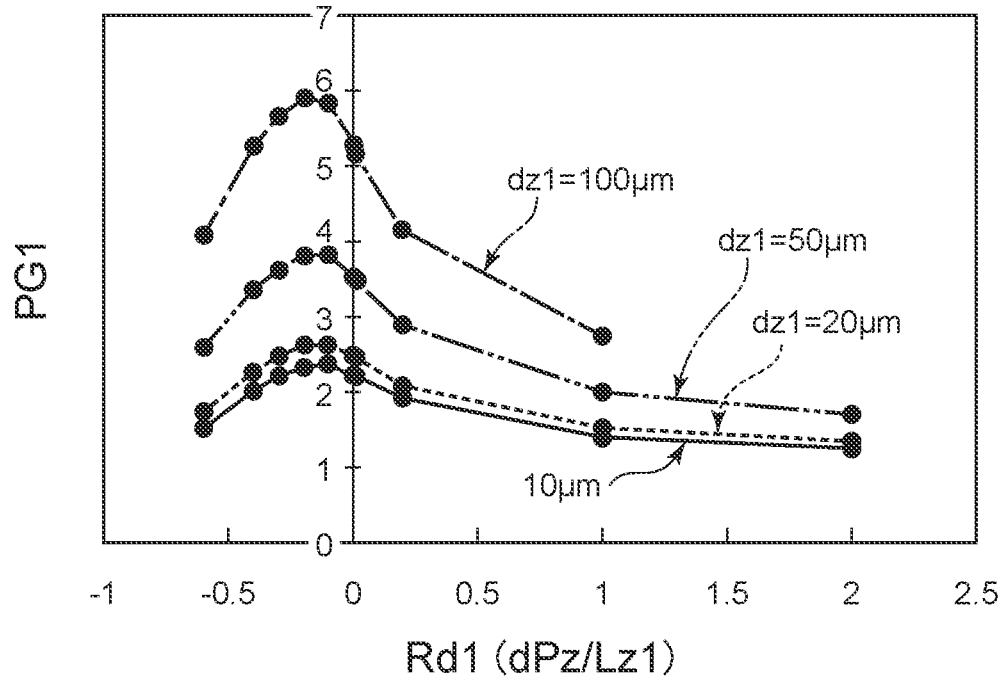
FIGS. 3A and 3B are graphs illustrating characteristics of the magnetic sensor.
Figure 3B:
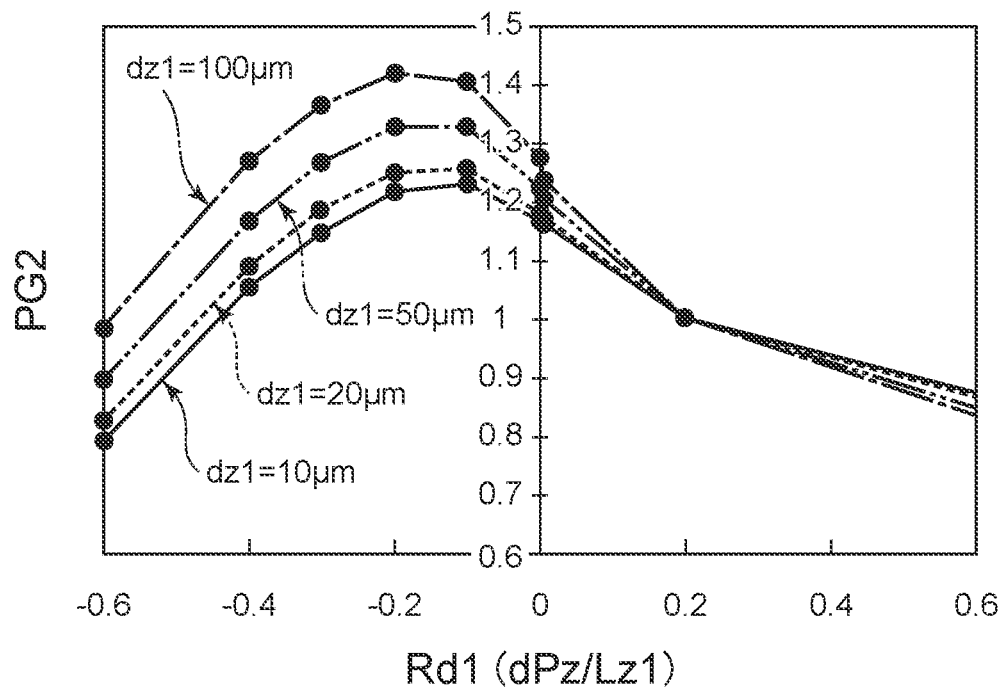

FIGS. 3A and 3B are graphs illustrating characteristics of the magnetic sensor.

The horizontal axis of FIG. 3A is a ratio Rd1. The ratio Rd1 is the ratio of a distance dPz to the length Lz1. dPz is described below. The distance dPz is the distance along the Z-axis direction between the end portion in the Z-axis direction of the first magnetic element 11E and the end portion in the Z-axis direction of the magnetic member 51. When the distance dPz is positive, the first magnetic element 11E does not overlap the magnetic member 51 in the Y-axis direction. When the distance dPz is negative, the first magnetic element 11E overlaps the magnetic member 51 in the Y-axis direction. When the distance dPz is negative, the absolute value of the distance dPz corresponds to the length (the width) of the portion (the portion 11P) of the first magnetic element 11E that overlaps the magnetic member 51 along the Z-axis direction. When the ratio Rd1 is positive, the first magnetic element 11E does not overlap the magnetic member 51 in the Y-axis direction. When the ratio Rd1 is negative, the first magnetic element 11E overlaps the magnetic member 51 in the Y-axis direction.

On the other hand, as described above, the length Lz1 corresponds to the length (the width) in the Z-axis direction of the first magnetic element 11E. When the ratio Rd1 is negative, the absolute value of the ratio Rd1 corresponds to the ratio of the length dP1 to the length Lz1.

The vertical axis of FIG. 3A is a gain PG1. The gain PG1 is an amount that corresponds to the amount of the magnetic flux converged to the inside of the first magnetic element 11E by the magnetic member 51. The gain PG1 is normalized by the amount of the magnetic flux converged inside the first magnetic element 11E when the magnetic member 51 is not included. When the gain PG1 is greater than 1, large amount of the magnetic flux is converged by the magnetic member 51, and the sensitivity increases. When the gain PG1 is greater than 1, high sensitivity is obtained.

As shown in FIG. 3A, a high gain PG1 is obtained when the ratio Rd1 is negative. Thus, it is favorable for the portion 11P of the first magnetic element 11E to overlap the magnetic member 51 in the Y-axis direction. A high gain PG1 is obtained thereby, and high sensitivity is obtained.

As shown in FIG. 3A, the gain PG1 decreases when the ratio Rd1 is negative and the absolute value of the ratio Rd1 is excessively large.

As described above, the gain PG1 changes with the ratio Rd1. As shown in FIG. 3A, the gain PG1 changes with the distance dz1.

The horizontal axis of FIG. 3B is the ratio Rd1. The vertical axis of FIG. 3B, a normalized gain PG2. The normalized gain PG2 is the value of the gain PG1 shown in FIG. 3A normalized by the gain PG1 when the ratio Rd1 is +0.2. When the ratio Rd1 is +0.2, the distance between the end portion of the first magnetic element 11E and the end portion of the magnetic member 51 along the Z-axis direction is 1 μm. When the normalized gain PG2 is not less than 1, the sensitivity can be increased by setting the ratio Rd1 being negative.

It can be seen from FIG. 3B that the normalized gain PG2 is not less than 1 when the distance dz1 is 10 μm and when the absolute value of the ratio Rd1 is not more than about 0.4. Thus, it is favorable for the absolute value of the ratio Rd1 to be not more than 0.4. As described above, the first magnetic element 11E overlaps the magnetic member 51 in the Y-axis direction when the distance dPz is negative (the ratio Rd1 is negative). Accordingly, it is favorable for the first magnetic element 11E to overlap the magnetic member 51 in the Y-axis direction and for the ratio (dP1/Lz1) of the length dP1 to the length Lz1 to be not more than 0.4.

Figure 4:
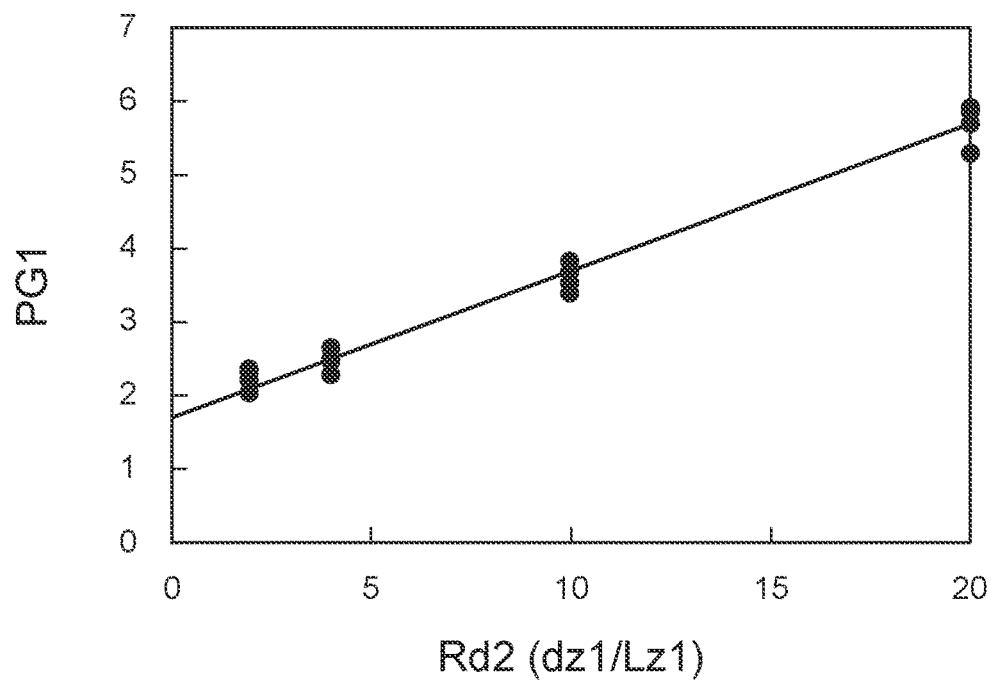
FIG. 4 is a graph illustrating a characteristic of the magnetic sensor.

FIG. 4 is a graph illustrating a characteristic of the magnetic sensor.

The horizontal axis of FIG. 4A is a ratio Rd2. The ratio Rd2 is the ratio of the distance dz1 between the base body end portion 55e and the first magnetic element 11E to the length Lz1 along the third direction (the Z-axis direction) of the first magnetic element 11E (i.e., dz1/Lz1). The vertical axis of FIG. 4 is the gain PG1. FIG. 4 shows all of the values of FIG. 3B that satisfy dP1/Lz1 being not more than 0.4. It can be seen from FIG. 4 that the gain PG1 is greater than 2 when the ratio Rd2 is not less than 1.5. According to the embodiment, it is favorable for the ratio Rd2 (i.e., dz1/Lz1) to be not less than 1.5. The ratio Rd2 may be not less than 2.0.

Examples of the multiple magnetic elements will now be described.

As shown in FIG. 1A, the length along the second direction (e.g., the X-axis direction) of the first magnetic element 11E is taken as a length Lx1. For example, the length Lx1 is greater than the length Lz1 along the third direction (the Z-axis direction) of the first magnetic element 11E. The length along the second direction (e.g., the X-axis direction) of the second magnetic element 12E is taken as a length Lx2. For example, the length Lx2 is greater than the length Lz2 along the third direction (the Z-axis direction) of the second magnetic element 12E. The length along the second direction (e.g., the X-axis direction) of the third magnetic element 13E is taken as a length Lx3. For example, the length Lx3 is greater than the length Lz3 along the third direction (the Z-axis direction) of the third magnetic element 13E. The length along the second direction (e.g., the X-axis direction) of the fourth magnetic element 14E is taken as a length Lx4. For example, the length Lx4 is greater than the length Lz4 along the third direction (the Z-axis direction) of the fourth magnetic element 14E. Because the lengths Lz1 to Lz4 are short, for example, a magnetic field from the detection object 80 that has a component in the third direction (the Z-axis direction) can be efficiently detected. Because all the lengths of Lz1, Lz2, Lz3 and Lz4 are short, for example, the distance between the magnetic member 51 and the detection object 80 can be short. A higher spatial resolution is obtained.

For example, it is favorable for the length Lx1 along the second direction of the first magnetic element 11E to be not less than 5 times the length Lz1 along the third direction of the first magnetic element 11E. For example, it is favorable for the length Lx2 along the second direction of the second magnetic element 12E to be not less than 5 times the length Lz2 along the third direction of the second magnetic element 12E. For example, it is favorable for the length Lx3 along the second direction of the third magnetic element 13E to be not less than 5 times the length Lz3 along the third direction of the third magnetic element 13E. For example, it is favorable for the length Lx4 along the second direction of the fourth magnetic element 14E to be not less than 5 times the length Lz4 along the third direction of the fourth magnetic element 14E. By such aspect ratios, the orientation of the magnetization of the magnetic layer and the counter magnetic layer of each of the multiple magnetic elements can be stabilized at the initial state. More stable detection is possible.

As shown in FIG. 1B, the length along the first direction (the Y-axis direction) of the magnetic member 51 is taken as a length Ly51 (the thickness). It is favorable for the length Ly51 to be greater than a length Ly11 (the thickness) along the first direction of the first magnetic element 11E. As shown in FIG. 2A, it is favorable for the length Ly51 to be greater than a length Ly12 (the thickness) along the first direction of the second magnetic element 12E. As shown in FIG. 2B, it is favorable for the length Ly51 to be greater than a length Ly13 (the thickness) along the first direction of the third magnetic element 13E. As shown in FIG. 2C, it is favorable for the length Ly51 to be greater than a length Ly14 (the thickness) along the first direction of the fourth magnetic element 14E. Because the magnetic member 51 is thick, the magnetic field from the detection object 80 can be more effectively concentrated, and the concentrated magnetic field can be effectively applied to the multiple magnetic elements. For example, higher sensitivity is easily obtained. For example, the length Ly51 is not less than 2 times the length Ly11. The length Ly51 may be not more than 1000 times the length Ly11.

As shown in FIG. 1B, the distance along the first direction (the Y-axis direction) between the first magnetic element 11E (the portion 11P) and the magnetic member 51 is taken as a distance dy1. It is favorable for the distance dy1 to be, for example, not less than 1/1000 Times the Length Lz1 and not More than 2 times the length Ly51. As shown in FIG. 2A, the distance along the first direction (the Y-axis direction) between the second magnetic element 12E (the portion 12P) and the magnetic member 51 is taken as a distance dy2. It is favorable for the distance dy2 to be, for example, not less than 1/1000 times the length Lz2 and not more than 2 times the length Ly51. As shown in FIG. 2B, the distance along the first direction (the Y-axis direction) between the third magnetic element 13E (the portion 13P) and the magnetic member 51 is taken as a distance dy3. It is favorable for the distance dy3 to be, for example, not less than 1/1000 times the length Lz3 and not more than 2 times the length Ly51. As shown in FIG. 2C, the distance along the first direction (the Y-axis direction) between the fourth magnetic element 14E (the portion 14P) and the magnetic member 51 is taken as a distance dy4. It is favorable for the distance dy4 to be, for example, not less than 1/1000 times the length Lz4 and not more than 2 times the length Ly51. Because all the distances of dy1, sy2, dy3 and dy4 are short, the magnetic field that is concentrated by the magnetic member 51 can be effectively applied to the multiple magnetic elements. For example, higher sensitivity is easily obtained. The distances of dy1, dy2, dy3 and dy4 are, for example, not less than 5 nm. For example, high manufacturability is obtained thereby.

As shown in FIGS. 1B and 2A, the element part 10U may further include a first connection member 15a. As described below, the first connection member 15a is electrically connected with a portion of the first magnetic element 11E. At least a portion of the first connection member 15a is between the base body 55 and the magnetic member 51 in the first direction (the Y-axis direction).

As shown in FIG. 2A, the element part 10U may further include a second connection member 15b. As described below, the second connection member 15b is electrically connected with another portion of the first magnetic element 11E. The position in the third direction (the Z-axis direction) of the second connection member 15b is between the position in the third direction of the base body end portion 55e and the position in the third direction of at least one of the first magnetic element 11E or the second magnetic element 12E. In the example, at least a portion of the second magnetic element 12E is between at least a portion of the second connection member 15b and at least a portion of the first connection member 15a in the third direction (the Z-axis direction).

As shown in FIGS. 2B and 2C, the element part 10U may further include a third connection member 15c. As described below, the third connection member 15c is electrically connected with one of the second magnetic element 12E, the third magnetic element 13E, or the fourth magnetic element 14E. At least a portion of the third connection member 15c is between the base body 55 and the magnetic member 51 in the first direction (the Y-axis direction).

As shown in FIG. 2C, the element part 10U may further include a fourth connection member 15d. As described below, the fourth connection member 15d is electrically connected with one of the second magnetic element 12E, the third magnetic element 13E, or the fourth magnetic element 14E. The position in the third direction (the Z-axis direction) of the fourth connection member 15d is between the position in the third direction of the base body end portion 55e and the position in the third direction of one of the second magnetic element 12E, the third magnetic element 13E, or the fourth magnetic element 14E. In the example, at least a portion of the fourth magnetic element 14E is between at least a portion of the fourth connection member 15d and at least a portion of the third connection member 15c in the third direction (the Z-axis direction).

The multiple magnetic elements are electrically connected by such connection members. The distance between the base body end portion 55e and the multiple magnetic elements can be short. A portion of each of the multiple magnetic elements is easily located between the base body 55 and the magnetic member 51.

As shown in FIG. 1A and FIGS. 2A to 2C, the magnetic sensor 110 may include an insulating member 65. For example, a portion of the insulating member 65 is located between the magnetic member 51 and the multiple magnetic elements. For example, the multiple magnetic elements are located between the base body 55 and the insulating member 65. For example, the connection members are located between the base body 55 and the insulating member 65. By providing the insulating member 65, stable insulation of the conductive member is obtained.

As shown in FIG. 1A and FIGS. 2A to 2C, the element part 10U may include a conductive member 20. For example, the conductive member 20 includes first to fourth corresponding portions 21 to 24. The first corresponding portion 21 corresponds to the first magnetic element 11E. The second corresponding portion 22 corresponds to the second magnetic element 12E. The third corresponding portion 23 corresponds to the third magnetic element 13E. The fourth corresponding portion 24 corresponds to the fourth magnetic element 14E.

For example, the first corresponding portion 21 overlaps the first magnetic element 11E in the first direction (the Y-axis direction). The second corresponding portion 22 overlaps the second magnetic element 12E in the first direction. The third corresponding portion 23 overlaps the third magnetic element 13E in the first direction. The fourth corresponding portion 24 overlaps the fourth magnetic element 14E in the first direction.

As described below, the first current that includes an alternating current component is supplied to the conductive member 20. By using the first current, the magnetic field from the detection object 80 can be detected with higher sensitivity.

Examples of electrical connections of the multiple magnetic elements and the conductive member 20 will now be described.

Figure 5:
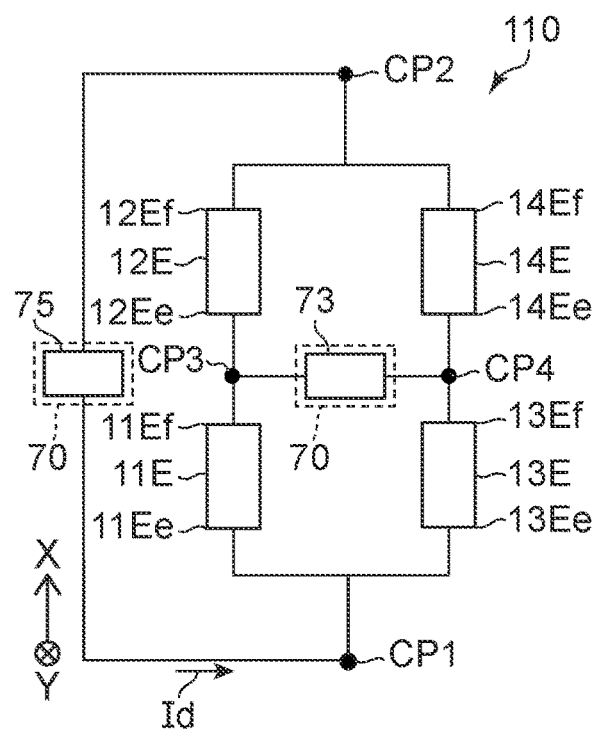
FIG. 5 is a schematic view illustrating the magnetic sensor according to the first embodiment.

FIG. 5 is a schematic view illustrating the magnetic sensor according to the first embodiment.

FIG. 5 shows an example of an electrical connection of the first to fourth magnetic elements 11E to 14E. In the illustration of FIG. 5, the spatial arrangement of the first to fourth magnetic elements 11E to 14E is modified from the example of FIG. 1A so that the electrical connectional relationship is easy to understand.

As shown in FIG. 5, the first magnetic element 11E includes one end portion 11Ee and another end portion 11Ef.

The direction from the one end portion 11Ee toward the other end portion 11Ef is along the X-axis direction. The second magnetic element 12E includes one end portion 12Ee and another end portion 12Ef. The direction from the one end portion 12Ee toward the other end portion 12Ef is along the X-axis direction. The third magnetic element 13E includes one end portion 13Ee and another end portion 13Ef. The direction from the one end portion 13Ee toward the other end portion 13Ef is along the X-axis direction. The fourth magnetic element 14E includes one end portion 14Ee and another end portion 14Ef. The direction from the one end portion 14Ee toward the other end portion 14Ef is along the X-axis direction. The one end portion 11Ee and the other end portion 11Ef may be interchanged with each other. The one end portion 12Ee and the other end portion 12Ef may be interchanged with each other. The one end portion 13Ee and the other end portion 13Ef may be interchanged with each other. The one end portion 14Ee and the other end portion 14Ef may be interchanged with each other.

As shown in FIG. 5, the other end portion 11Ef of the first magnetic element 11E is electrically connected with the one end portion 12Ee of the second magnetic element 12E. The one end portion 11Ee of the first magnetic element 11E is electrically connected with the one end portion 13Ee of the third magnetic element 13E. The other end portion 13Ef of the third magnetic element 13E is electrically connected with the one end portion 14Ee of the fourth magnetic element 14E. The other end portion 12Ef of the second magnetic element 12E is electrically connected with the other end portion 14Ef of the fourth magnetic element 14E. Thus, the first to fourth magnetic elements 11E to 14E have a bridge connection.

As shown in FIG. 5, the magnetic sensor 110 may further include an element current circuit 75. The element current circuit 75 is configured to supply an element current Id between a first connection point CP1 and a second connection point CP2, in which the first connection point CP1 is between the one end portion 11Ee of the first magnetic element 11E and the one end portion 13Ee of the third magnetic element 13E, and the second connection point CP2 is between the other end portion 12Ef of the second magnetic element 12E and the other end portion 14Ef of the fourth magnetic element 14E.

As shown in FIG. 5, the magnetic sensor 110 may further include a detection circuit 73. The detection circuit 73 is configured to detect the change of the potential between a third connection point CP3 and a fourth connection point CP4, in which the third connection point CP3 is between the other end portion 11Ef of the first magnetic element 11E and the one end portion 12Ee of the second magnetic element 12E, and the fourth connection point CP4 is between the other end portion 13Ef of the third magnetic element 13E and the one end portion 14Ee of the fourth magnetic element 14E.

Figure 6A:
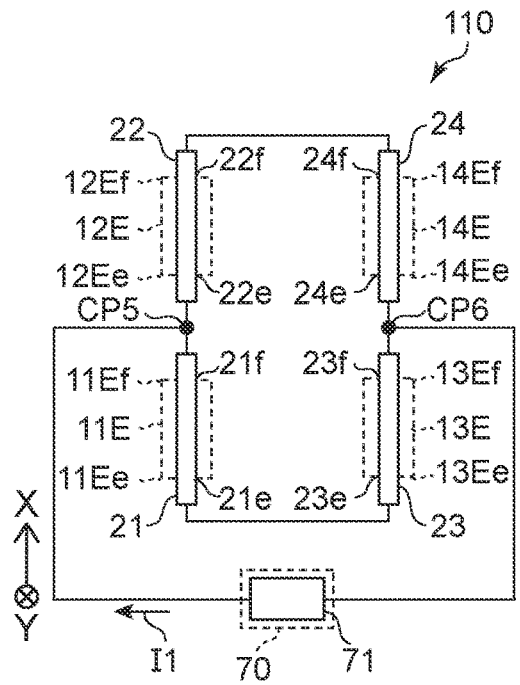
FIGS. 6A to 6D are schematic views illustrating magnetic sensors according to the first embodiment.
Figure 6B:
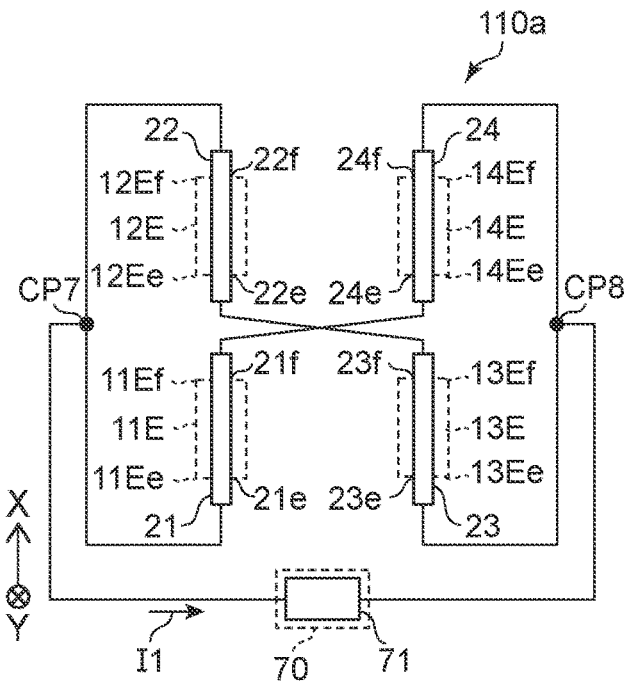
Figure 6C:
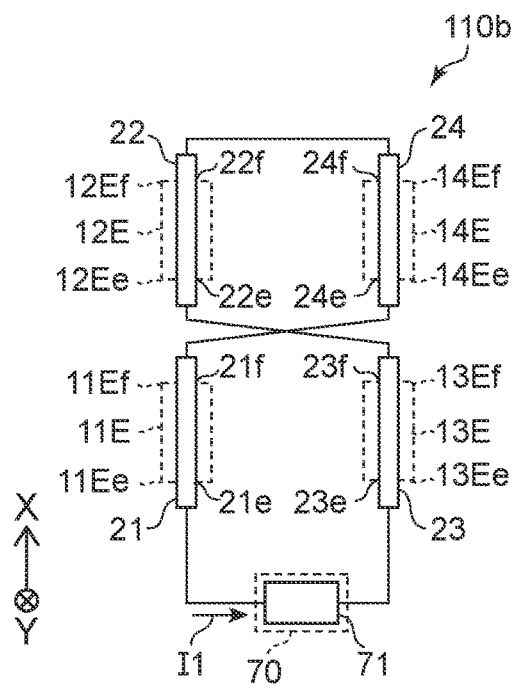
Figure 6D:
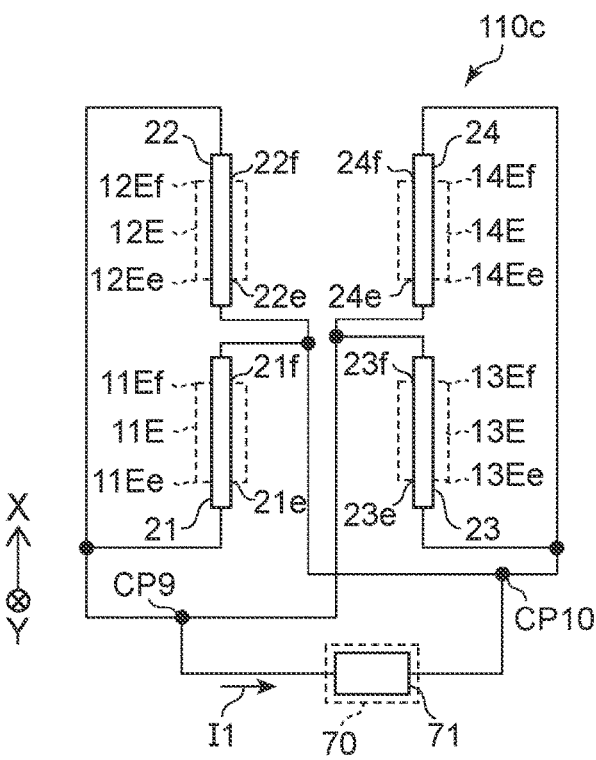

FIGS. 6A to 6D are schematic views illustrating magnetic sensors according to the first embodiment. FIGS. 6B to 6D show several examples of the electrical connection of the conductive member 20. In the illustrations of FIGS. 6A to 6D, the spatial arrangement of the first to fourth corresponding portions 21 to 24 is modified from the example of FIG. 1A so that the electrical connectional relationship is easy to understand. The configuration of the magnetic element illustrated in FIG. 5 may be combined with any of the configurations shown in FIGS. 6A to 6D.

As shown in FIG. 6A, the first corresponding portion 21 includes a first corresponding one-portion 21e and a first corresponding other-portion 21f. For example, the first corresponding one-portion 21e corresponds to the one end portion 11Ee of the first magnetic element 11E. For example, the first corresponding other-portion 21f corresponds to the other end portion 11Ef of the first magnetic element 11E. For example, the first corresponding one-portion 21e overlaps the one end portion 11Ee of the first magnetic element 11E in the first direction (the Y-axis direction). For example, the first corresponding other-portion 21f overlaps the other end portion 11Ef of the first magnetic element 11E in the first direction.

As shown in FIG. 6A, the second corresponding portion 22 includes a second corresponding one-portion 22e and a second corresponding other-portion 22f. For example, the second corresponding one-portion 22e corresponds to the one end portion 12Ee of the second magnetic element 12E. For example, the second corresponding other-portion 22f corresponds to the other end portion 12Ef of the second magnetic element 12E. For example, the second corresponding one-portion 22e overlaps the one end portion 12Ee of the second magnetic element 12E in the first direction (the Y-axis direction). For example, the second corresponding other-portion 22f overlaps the other end portion 12Ef of the second magnetic element 12E in the first direction.

As shown in FIG. 6A, the third corresponding portion 23 includes a third corresponding one-portion 23e and a third corresponding other-portion 23f. For example, the third corresponding one-portion 23e corresponds to the one end portion 13Ee of the third magnetic element 13E. For example, the third corresponding other-portion 23f corresponds to the other end portion 13Ef of the third magnetic element 13E. For example, the third corresponding one-portion 23e overlaps the one end portion 13Ee of the third magnetic element 13E in the first direction (the Y-axis direction). For example, the third corresponding other-portion 23f overlaps the other end portion 13Ef of the third magnetic element 13E in the first direction.

As shown in FIG. 6A, the fourth corresponding portion 24 includes a fourth corresponding one-portion 24e and a fourth corresponding other-portion 24f. For example, the fourth corresponding one-portion 24e corresponds to the one end portion 14Ee of the fourth magnetic element 14E. For example, the fourth corresponding other-portion 24f corresponds to the other end portion 14Ef of the fourth magnetic element 14E. For example, the fourth corresponding one-portion 24e overlaps the one end portion 14Ee of the fourth magnetic element 14E in the first direction (the Y-axis direction). For example, the fourth corresponding other-portion 24f overlaps the other end portion 14Ef of the fourth magnetic element 14E in the first direction.

In the example shown in FIG. 6A, the first corresponding one-portion 21e is electrically connected with the third corresponding one-portion 23e. The first corresponding other-portion 21f is electrically connected with the second corresponding one-portion 22e. The third corresponding other-portion 23f is electrically connected with the fourth corresponding one-portion 24e. The second corresponding other-portion 22f is electrically connected with the fourth corresponding other-portion 24f.

As shown in FIG. 6A, the magnetic sensor 110 may further include a first current circuit 71. The first current circuit 71 is configured to supply a first current I1 that includes an alternating current between a fifth connection point CP5 and a sixth connection point CP6, in which the fifth connection point CP5 is between the first corresponding other-portion 21f and the second corresponding one-portion 22e, and the sixth connection point CP6 is between the third corresponding other-portion 23f and the fourth corresponding one-portion 24e.

The magnetic field that is generated by the first current I1 flowing through the first corresponding portion 21 is applied to the first magnetic element 11E. The magnetic field that is generated by the first current I1 flowing through the second corresponding portion 22 is applied to the second magnetic element 12E. The magnetic field that is generated by the first current I1 flowing through the third corresponding portion 23 is applied to the third magnetic element 13E. The magnetic field that is generated by the first current I1 flowing through the fourth corresponding portion 24 is applied to the fourth magnetic element 14E.

For example, the element current Id may be a substantially direct current. The orientation of the element current Id is as shown in FIG. 5. The element current Id flows through the first magnetic element 11E in the orientation from the one end portion 11Ee of the first magnetic element 11E toward the other end portion 11Ef of the first magnetic element 11E. The element current Id flows through the second magnetic element 12E in the orientation from the one end portion 12Ee of the second magnetic element 12E toward the other end portion 12Ef of the second magnetic element 12E. The element current Id flows through the third magnetic element 13E in the orientation from the one end portion 13Ee of the third magnetic element 13E toward the other end portion 13Ef of the third magnetic element 13E. The element current Id flows through the fourth magnetic element 14E in the orientation from the one end portion 14Ee of the fourth magnetic element 14E toward the other end portion 14Ef of the fourth magnetic element 14E.

In the example shown in FIG. 6A, for example, the orientation of the first current I1 at one time (a first time) when the first current I1 that includes the alternating current component is supplied to the conductive member 20 is as follows. The first current I1 flows through the first corresponding portion 21 in the orientation from the first corresponding other-portion 21f toward the first corresponding one-portion 21e. The first current I1 flows through the second corresponding portion 22 in the orientation from the second corresponding one-portion 22e toward the second corresponding other-portion 22f. The first current I1 flows through the third corresponding portion 23 in the orientation from the third corresponding one-portion 23e toward the third corresponding other-portion 23f. The first current I1 flows through the fourth corresponding portion 24 in the orientation from the fourth corresponding other-portion 24f toward the fourth corresponding one-portion 24e.

For example, the relationship between the orientation of the first current I1 flowing through the second corresponding portion 22 at the first time and the orientation of the element current Id flowing through the second magnetic element 12E is opposite to (the opposite phase of) the relationship between the orientation of the first current I1 flowing through the first corresponding portion 21 at the first time and the orientation of the element current Id flowing through the first magnetic element 11E. The relationship between the orientation of the first current I1 flowing through the fourth corresponding portion 24 at the first time and the orientation of the element current Id flowing through the fourth magnetic element 14E is opposite to (the opposite phase of) the relationship between the orientation of the first current I1 flowing through the third corresponding portion 23 at the first time and the orientation of the element current Id flowing through the third magnetic element 13E.

At the first time in the example shown in FIG. 6A, the first current I1 has the orientation from the first corresponding other-portion 21f toward the first corresponding one-portion 21e, the orientation from the second corresponding one-portion 22e toward the second corresponding other-portion 22f, the orientation from the third corresponding one-portion 23e toward the third corresponding other-portion 23f, and the orientation from the fourth corresponding other-portion 24f toward the fourth corresponding one-portion 24e.

In the example shown in FIG. 6A, a first circuit that includes the first and third corresponding portions 21 and 23 that are connected in series is provided. A second circuit that includes the second and fourth corresponding portions 22 and 24 that are connected in series is provided. The first circuit and the second circuit are electrically connected in parallel.

The noise can be further suppressed by such a combination of the first to fourth magnetic elements 11E to 14E and the first to fourth corresponding portions 21 to 24. Examples of the signals obtained from the first to fourth magnetic elements 11E to 14E are described below.

In a magnetic sensor 110a as shown in FIG. 6B, the first corresponding one-portion 21e is electrically connected with the second corresponding other-portion 22f. The first corresponding other-portion 21f is electrically connected with the fourth corresponding one-portion 24e. The third corresponding one-portion 23e is electrically connected with the fourth corresponding other-portion 24f. The third corresponding other-portion 23f is electrically connected with the second corresponding one-portion 22e.

In the magnetic sensor 110a, the first current circuit 71 is configured to supply the first current I1 that includes the alternating current between a seventh connection point CP7 and an eighth connection point CP8, in which the seventh connection point CP7 is between the first corresponding one-portion 21e and the second corresponding other-portion 22f, and the eighth connection point CP8 is between the third corresponding one-portion 23e and the fourth corresponding other-portion 24f.

At one time (the first time) in the magnetic sensor 110a, the first current I1 has the orientation from the first corresponding other-portion 21f toward the first corresponding one-portion 21e, the orientation from the second corresponding one-portion 22e toward the second corresponding other-portion 22f, the orientation from the third corresponding one-portion 23e toward the third corresponding other-portion 23f, and the orientation from the fourth corresponding other-portion 24f toward the fourth corresponding one-portion 24e. A configuration such as that shown in FIG. 6B may be combined with the configuration of FIG. 5.

In the example shown in FIG. 6B, the first circuit that includes the first and fourth corresponding portions 21 and 24 that are connected in series is provided. The second circuit that includes the second and third corresponding portions 22 and 23 that are connected in series is provided. The first circuit and the second circuit are electrically connected in parallel.

In a magnetic sensor 110b as shown in FIG. 6C, the first corresponding other-portion 21f is electrically connected with the fourth corresponding one-portion 24e. The third corresponding other-portion 23f is electrically connected with the second corresponding one-portion 22e. The second corresponding other-portion 22f is electrically connected with the fourth corresponding other-portion 24f.

In the magnetic sensor 110b, the first current circuit 71 is configured to supply the first current I1 that includes the alternating current between the first corresponding one-portion 21e and the third corresponding one-portion 23e.

At one time (the first time) in the magnetic sensor 110b, the first current I1 has the orientation from the first corresponding other-portion 21f toward the first corresponding one-portion 21e, the orientation from the second corresponding one-portion 22e toward the second corresponding other-portion 22f, the orientation from the third corresponding one-portion 23e toward the third corresponding other-portion 23f, and the orientation from the fourth corresponding other-portion 24f toward the fourth corresponding one-portion 24e. A configuration such as that shown in FIG. 6C may be combined with the configuration of FIG. 5.

In the example shown in FIG. 6C, the first to fourth corresponding portions 21 to 24 are electrically connected in series to each other.

In a magnetic sensor 110c as shown in FIG. 6D, the first corresponding one-portion 21e is electrically connected with the second corresponding other-portion 22f, the third corresponding other-portion 23f, and the fourth corresponding one-portion 24e. The first corresponding other-portion 21f is electrically connected with the second corresponding one-portion 22e, the third corresponding one-portion 23e, and the fourth corresponding other-portion 24f.

In the magnetic sensor 110c, the first current circuit 71 is configured to supply the first current I1 that includes the alternating current between a ninth connection point CP9 and a tenth connection point CP10, in which the ninth connection point CP9 is between the first corresponding one-portion 21e, the second corresponding other-portion 22f, the third corresponding other-portion 23f, and the fourth corresponding one-portion 24e, and the tenth connection point CP10 is between the first corresponding other-portion 21f, the second corresponding one-portion 22e, the third corresponding one-portion 23e, and the fourth corresponding other-portion 24f.

At one time (the first time) in the magnetic sensor 110c, the first current I1 has the orientation from the first corresponding other-portion 21f toward the first corresponding one-portion 21e, the orientation from the second corresponding one-portion 22e toward the second corresponding other-portion 22f, the orientation from the third corresponding one-portion 23e toward the third corresponding other-portion 23f, and the orientation from the fourth corresponding other-portion 24f toward the fourth corresponding one-portion 24e. A configuration such as that shown in FIG. 6D may be combined with the configuration of FIG. 5.

In the example shown in FIG. 6D, the first to fourth corresponding portions 21 to 24 are electrically connected in parallel to each other.

The element current circuit 75, the detection circuit 73, and the first current circuit 71 may be included in a control circuit part 70.

In the example shown in FIG. 5, the magnetic element that is electrically connected in series with the first magnetic element 11E is taken to be the second magnetic element 12E. The magnetic element that is electrically connected in series with the third magnetic element 13E is taken to be the fourth magnetic element 14E. The set that includes the first and second magnetic elements 11E and 12E is electrically connected in parallel with the set that includes the third and fourth magnetic elements 13E and 14E. Various modifications of the spatial arrangement of the first to fourth magnetic elements 11E to 14E are possible.

The portions of the circuits illustrated in FIGS. 6A to 6D may be combined. For example, the first corresponding portion 21 and the third corresponding portion 24 that are connected in series may be connected with the first current circuit 71 in parallel with the second and third corresponding portions 22 and 23.

Examples of the spatial arrangement of the first to fourth magnetic elements 11E to 14E will now be described. The following are examples in which the first to fourth magnetic elements 11E to 14E are arranged in this order along the second direction (e.g., the X-axis direction). In the following example, the magnetic element that is electrically connected in series with the first magnetic element 11E may be one of the second magnetic element 12E, the third magnetic element 13E, or the fourth magnetic element 14E. The magnetic element that is electrically connected in series with the third magnetic element 13E may be one of the first magnetic element 11E, the second magnetic element 12E, or the fourth magnetic element 14E.

FIGS. 7A to 7C, FIGS. 8A to 8C, FIGS. 9A to 9C, FIGS. 10A to 10C, FIGS. 11A to 11C, and FIGS. 12A to 12C are schematic views illustrating the magnetic sensor according to the first embodiment.

FIGS. 7A, 8A, 9A, 10A, 11A, and 12A illustrate first to sixth element configurations CF1 to CF6 that relate to the connection of the first to fourth magnetic elements 11E to 14E. FIGS. 7B, 7C, 8B, 8C, 9B, 9C, 10B, 10C, 11B, 11C, 12B, and 12C illustrate first to twelfth corresponding portion configurations CG1 to CG12 that relate to the connection of the first to fourth corresponding portions 21 to 24.

Figure 7A:
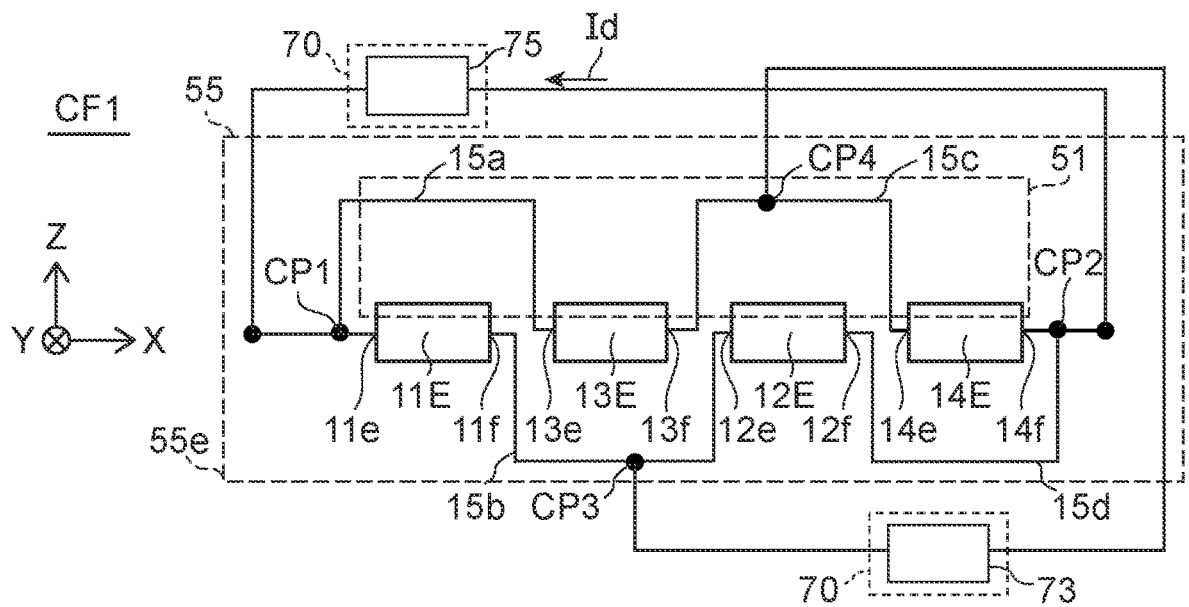
FIGS. 7A to 7C are schematic views illustrating the magnetic sensor according to the first embodiment.

In the first element configuration CF1 as shown in FIG. 7A, the multiple magnetic elements are arranged along the X-axis direction in the order of the first magnetic element 11E, the third magnetic element 13E, the second magnetic element 12E, and the fourth magnetic element 14E.

Figure 7B:
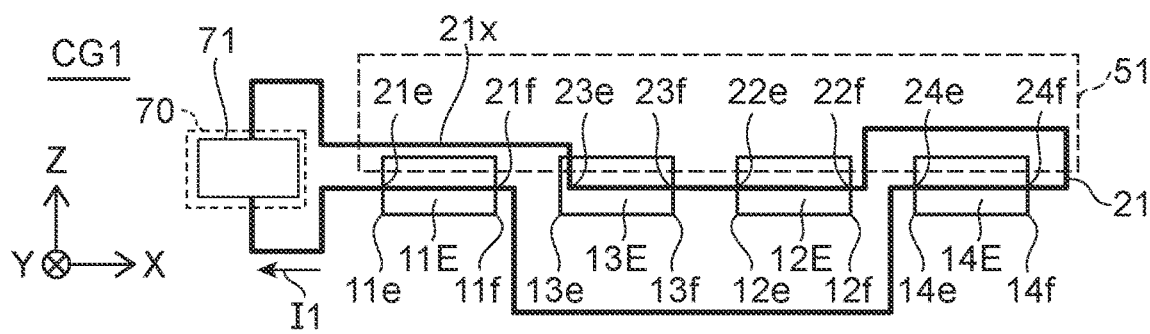

In the first corresponding portion configuration CG1 as shown in FIG. 7B, the first corresponding one-portion 21e is connected with the first current circuit 71. The first corresponding other-portion 21f is connected with the second corresponding one-portion 22e. The second corresponding other-portion 22f is connected with the fourth corresponding other-portion 24f. The fourth corresponding one-portion 24e is connected with the third corresponding other-portion 23f. The third corresponding one-portion 23e is connected with the first current circuit 71.

In the first corresponding portion configuration CG1, the first to fourth corresponding portions 21 to 24 are electrically connected in series. In the first corresponding portion configuration CG1, the first current I1 has the orientation described with reference to FIG. 6C.

Figure 7C:
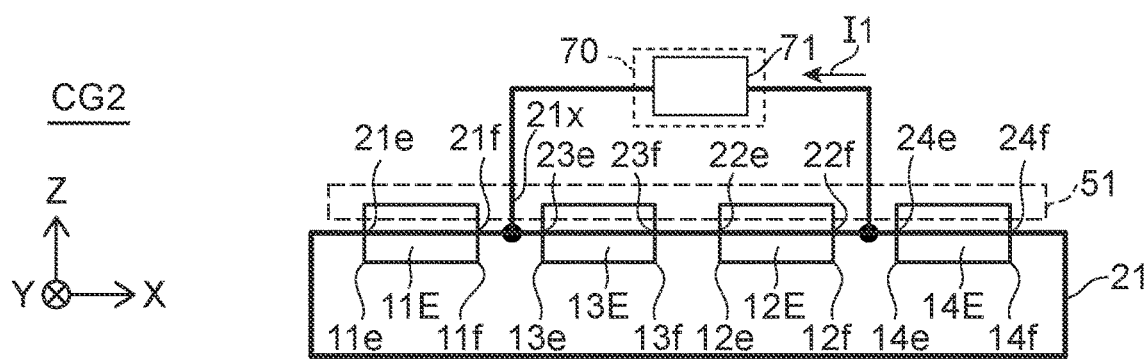

In the second corresponding portion configuration CG2 as shown in FIG. 7C, the first corresponding other-portion 21f is connected with the first current circuit 71. The first corresponding one-portion 21e is connected with the fourth corresponding other-portion 24f. The fourth corresponding one-portion 24e is connected with the first current circuit 71. The third corresponding one-portion 23e is connected with the first current circuit 71. The third corresponding other-portion 23f is connected with the second corresponding one-portion 22e. The second corresponding other-portion 22f is connected with the first current circuit 71.

The second corresponding portion configuration CG2 includes the first circuit that includes the first and fourth corresponding portions 21 and 24 that are connected in series. The second circuit that includes the second and third corresponding portions 22 and 23 that are connected in series is provided. The first circuit and the second circuit are electrically connected in parallel. In the second corresponding portion configuration CG2, the first current I1 has the orientation described with reference to FIG. 6B.

The first element configuration CF1 may be combined with one of the first corresponding portion configuration CG1 or the second corresponding portion configuration CG2.

Figure 8A:
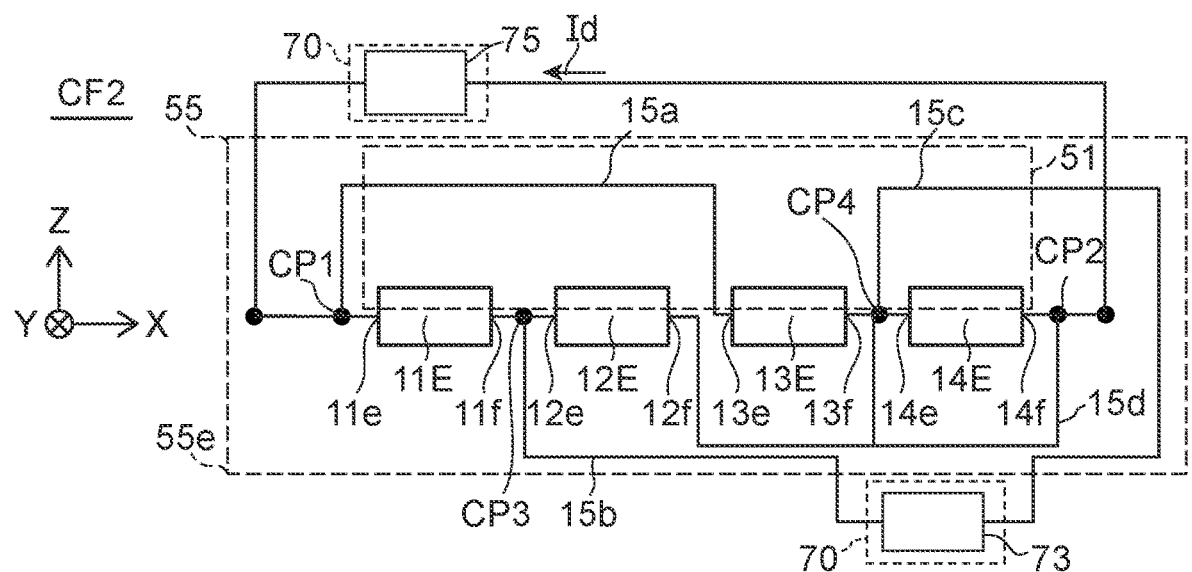
FIGS. 8A to 8C are schematic views illustrating the magnetic sensor according to the first embodiment.

In the second element configuration CF2 as shown in FIG. 8A, the multiple magnetic elements are arranged along the X-axis direction in the order of the first magnetic element 11E, the second magnetic element 12E, the third magnetic element 13E, and the fourth magnetic element 14E.

Figure 8B:
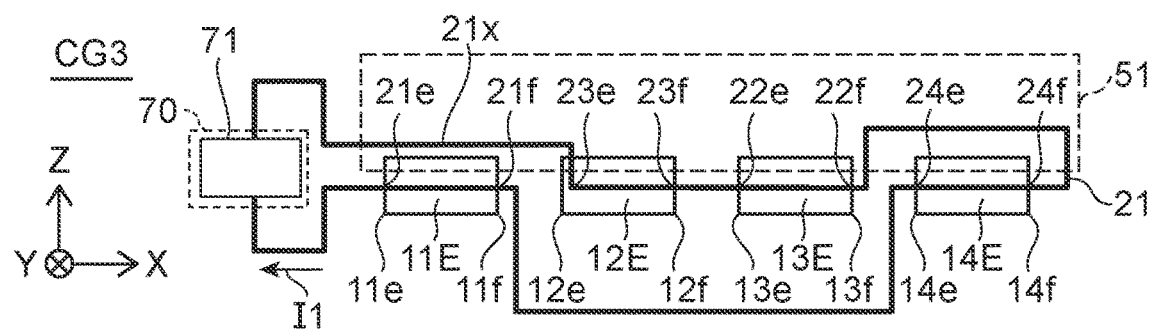

In the third corresponding portion configuration CG3 as shown in FIG. 8B, the first to fourth corresponding portions 21 to are electrically connected in series. In the third corresponding portion configuration CG3, the first current I1 has the orientation described with reference to FIG. 6C.

Figure 8C:
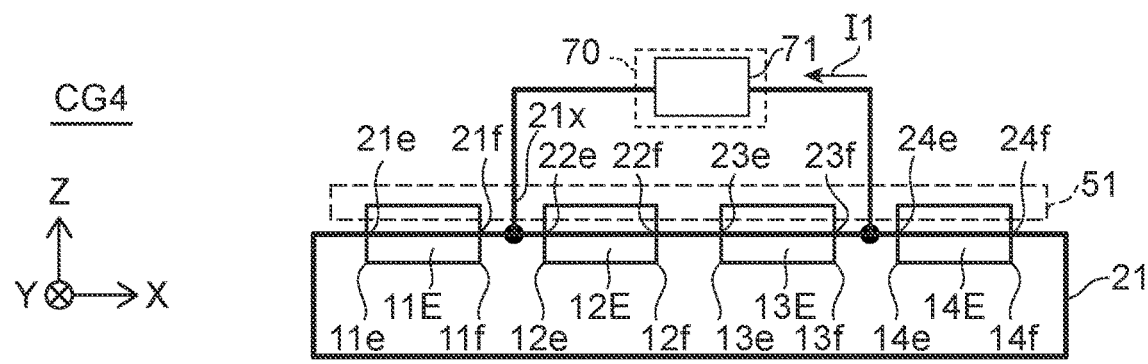

As shown in FIG. 8C, the fourth corresponding portion configuration CG4 includes the first circuit that includes the first and fourth corresponding portions 21 and 24 that are connected in series. The second circuit that includes the second and third corresponding portions 22 and 23 that are connected in series is provided. The first circuit and the second circuit are electrically connected in parallel. In the fourth corresponding portion configuration CG4, the first current I1 has the orientation described with reference to FIG. 6B. The second element configuration CF2 may be combined with one of the third corresponding portion configuration CG3 or the fourth corresponding portion configuration CG4.

Figure 9A:
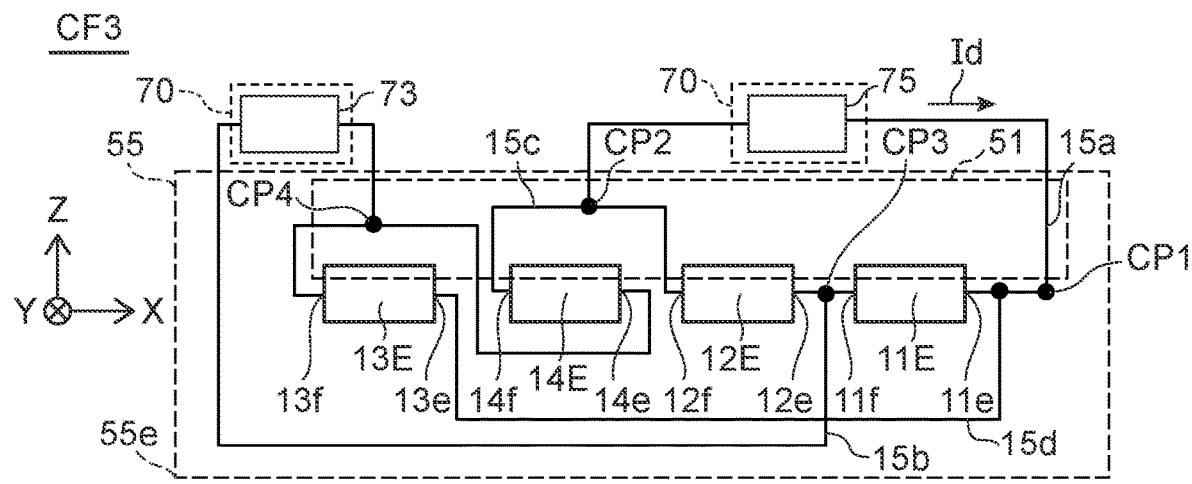
FIGS. 9A to 9C are schematic views illustrating the magnetic sensor according to the first embodiment.

In the third element configuration CF3 as shown in FIG. 9A, the multiple magnetic elements are arranged along the X-axis direction in the order of the third magnetic element 13E, the fourth magnetic element 14E, the second magnetic element 12E, and the first magnetic element 11E.

Figure 9B:
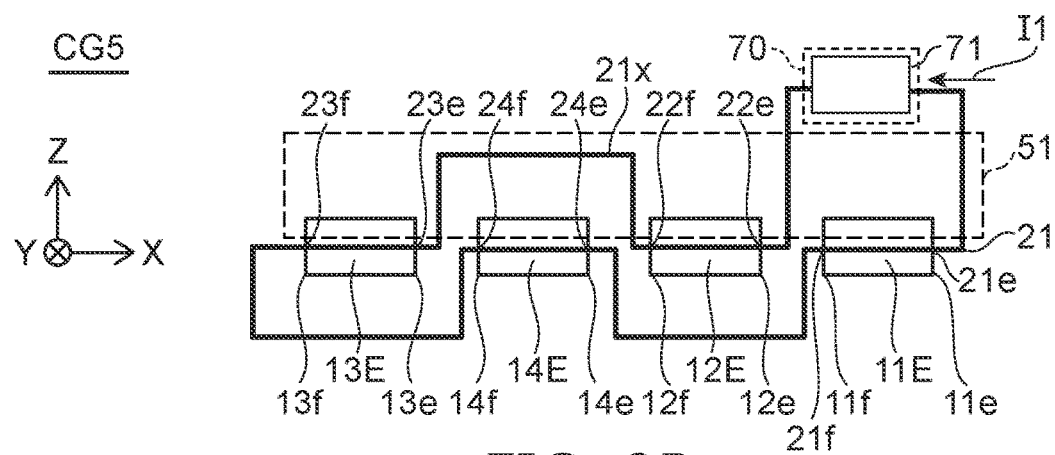

In the fifth corresponding portion configuration CG5 as shown in FIG. 9B, the first to fourth corresponding portions 21 to are electrically connected in series. In the fifth corresponding portion configuration CG5, the first current I1 has the orientation described with reference to FIG. 6C.

Figure 9C:
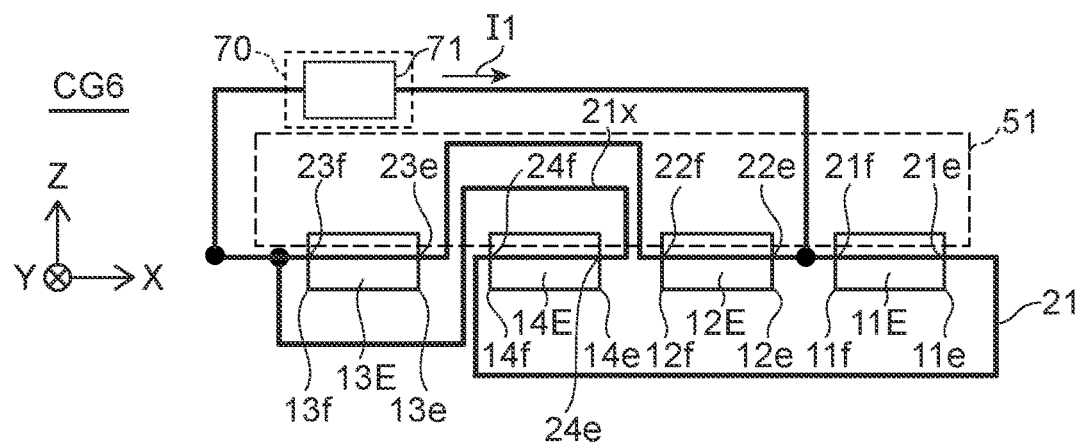

As shown in FIG. 9C, the sixth corresponding portion configuration CG6 includes the first circuit that includes the first and fourth corresponding portions 21 and 24 that are connected in series. The second circuit that includes the second and third corresponding portions 22 and 23 that are connected in series is provided. The first circuit and the second circuit are electrically connected in parallel. In the sixth corresponding portion configuration CG6, the first current I1 has the orientation described with reference to FIG. 6B. The third element configuration CF3 may be combined with one of the fifth corresponding portion configuration CG5 or the sixth corresponding portion configuration CG6.

Figure 10A:
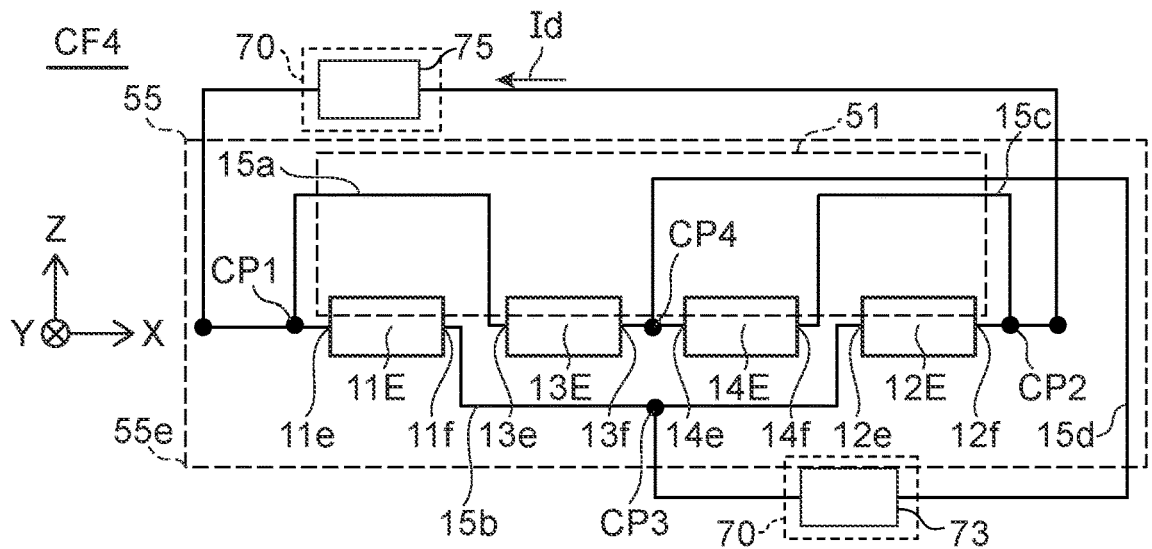
FIGS. 10A to 10C are schematic views illustrating the magnetic sensor according to the first embodiment.

In the fourth element configuration CF4 as shown in FIG. 10A, the multiple magnetic elements are arranged along the X-axis direction in the order of the first magnetic element 11E, the third magnetic element 13E, the fourth magnetic element 14E, and the second magnetic element 12E.

Figure 10B:
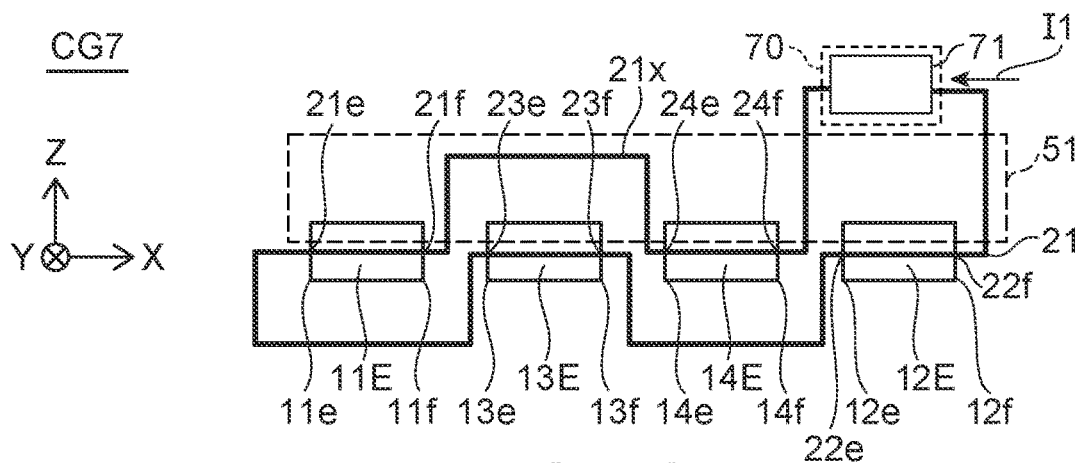

In the seventh corresponding portion configuration CG7 as shown in FIG. 10B, the first to fourth corresponding portions 21 to 24 are electrically connected in series. In the seventh corresponding portion configuration CG7, the first current I1 has the orientation described with reference to FIG. 6C.

Figure 10C:
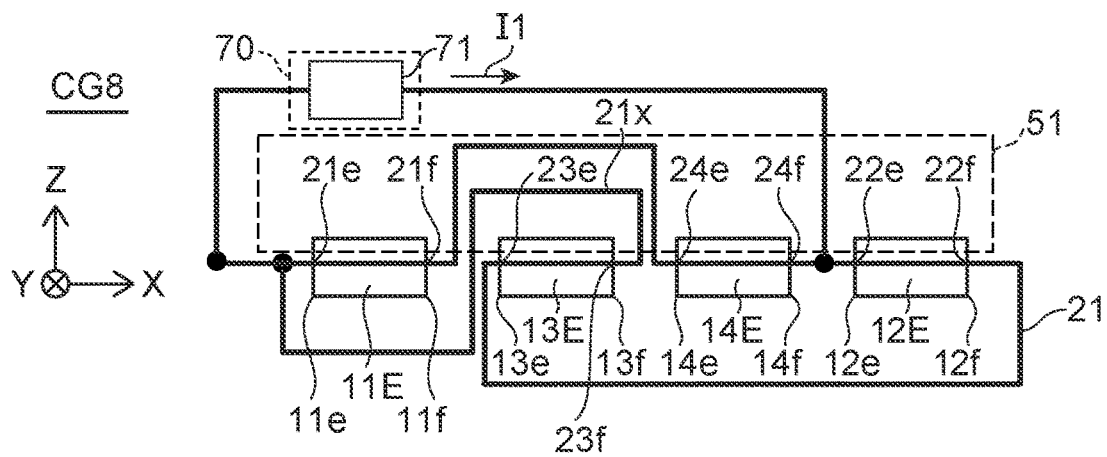

As shown in FIG. 10C, the eighth corresponding portion configuration CG8 includes the first circuit that includes the first and fourth corresponding portions 21 and 24 that are connected in series. The second circuit that includes the second and third corresponding portions 22 and 23 that are connected in series is provided. The first circuit and the second circuit are electrically connected in parallel. In the eighth corresponding portion configuration CG8, the first current I1 has the orientation described with reference to FIG. 6B. The fourth element configuration CF4 may be combined with one of the seventh corresponding portion configuration CG7 or the eighth corresponding portion configuration CG8.

Figure 11A:
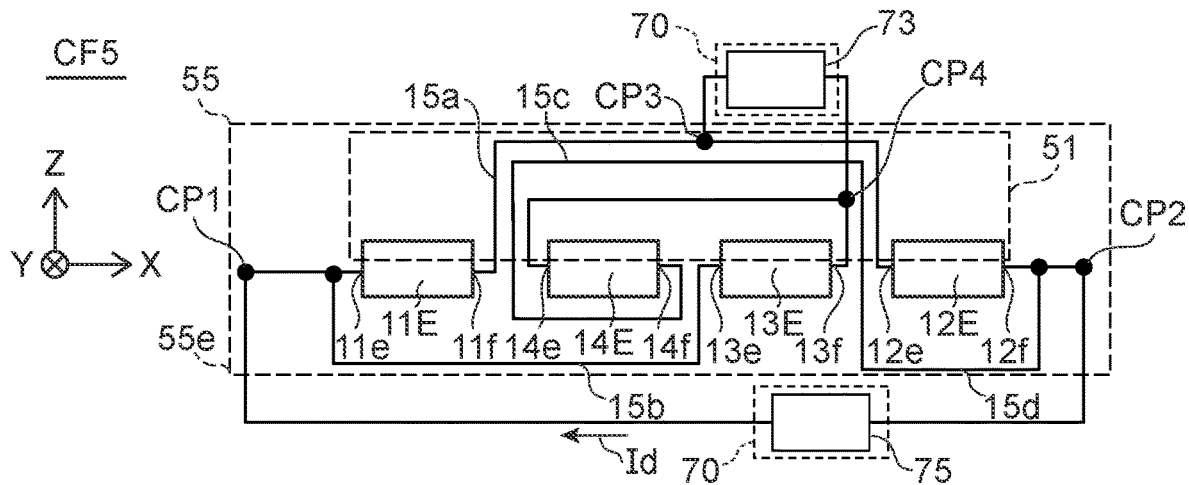
FIGS. 11A to 11C are schematic views illustrating the magnetic sensor according to the first embodiment.

In the fifth element configuration CF5 as shown in FIG. 11A, the multiple magnetic elements are arranged along the X-axis direction in the order of the first magnetic element 11E, the fourth magnetic element 14E, the third magnetic element 13E, and the second magnetic element 12E.

Figure 11B:
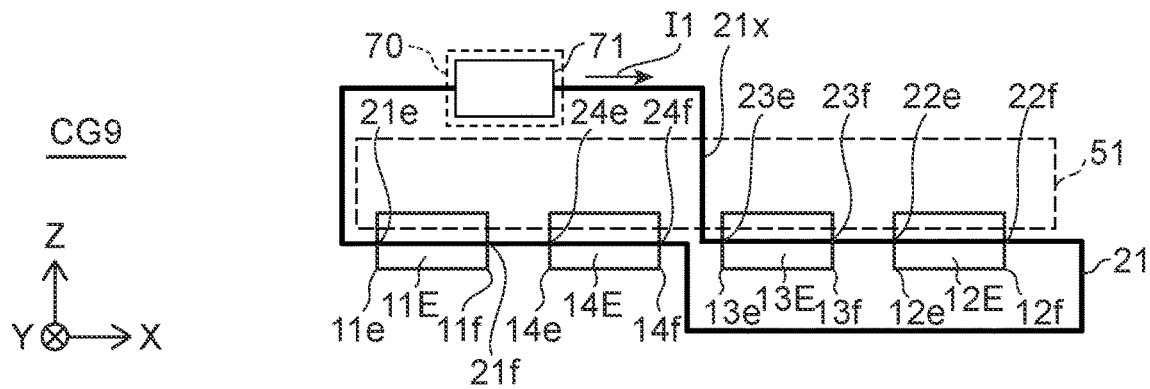

In the ninth corresponding portion configuration CG9 as shown in FIG. 11B, the first to fourth corresponding portions 21 to 24 are electrically connected in series. In the ninth corresponding portion configuration CG9, the first current I1 has the orientation described with reference to FIG. 6C.

Figure 11C:
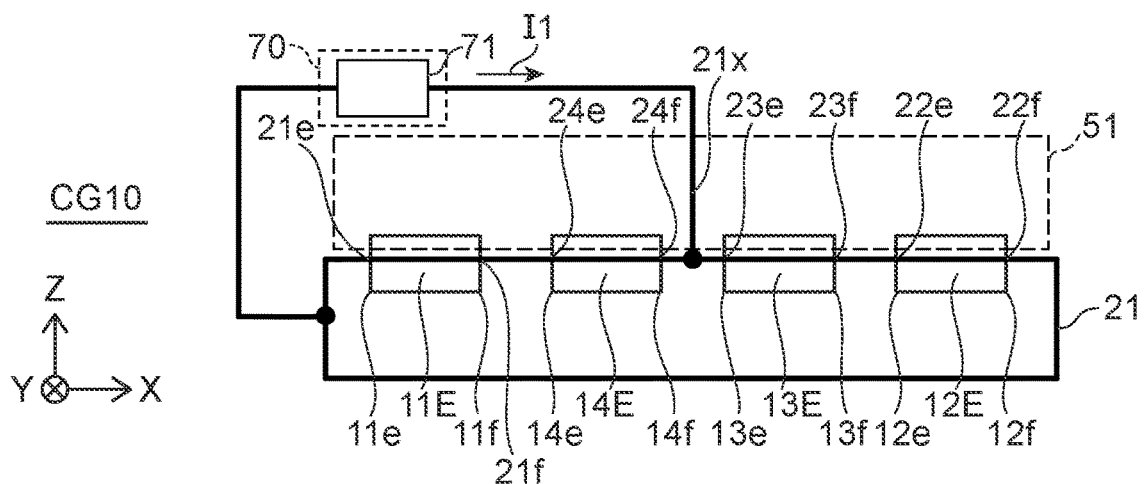

As shown in FIG. 11C, the tenth corresponding portion configuration CG10 includes the first circuit that includes the first and fourth corresponding portions 21 and 24 that are connected in series. The second circuit that includes the second and third corresponding portions 22 and 23 that are connected in series is provided. The first circuit and the second circuit are electrically connected in parallel. In the tenth corresponding portion configuration CG10, the first current I1 has the orientation described with reference to FIG. 6B. The fifth element configuration CF5 may be combined with one of the ninth corresponding portion configuration CG9 or the tenth corresponding portion configuration CG10.

Figure 12A:
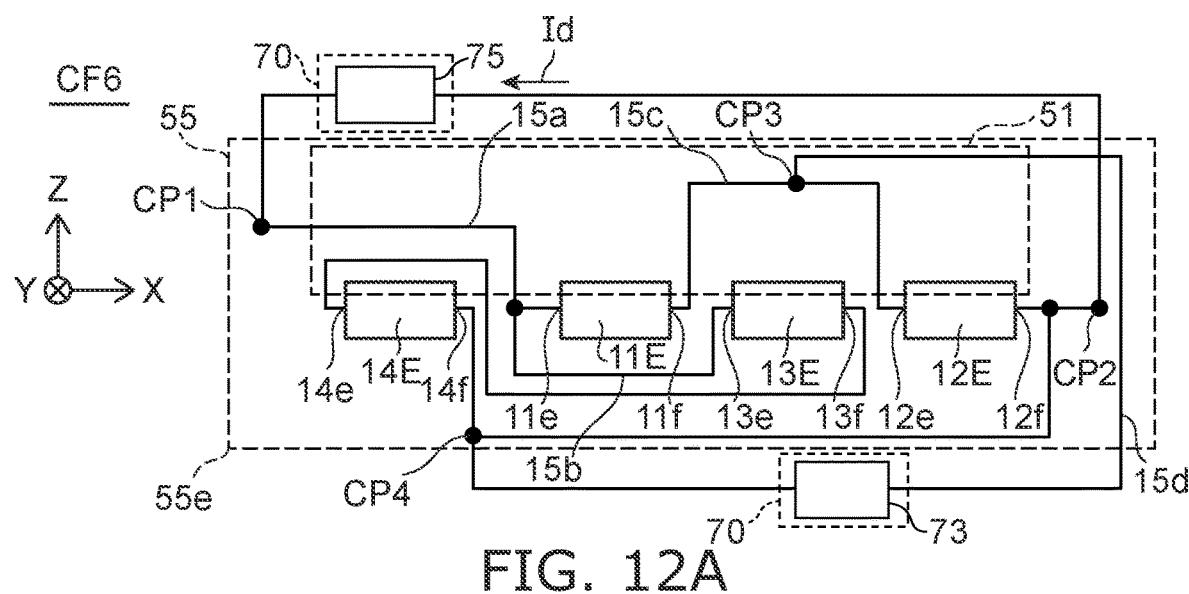
FIGS. 12A to 12C are schematic views illustrating the magnetic sensor according to the first embodiment.

In the sixth element configuration CF6 as shown in FIG. 12A, the multiple magnetic elements are arranged along the X-axis direction in the order of the fourth magnetic element 14E, the first magnetic element 11E, the third magnetic element 13E, and the second magnetic element 12E.

Figure 12B:
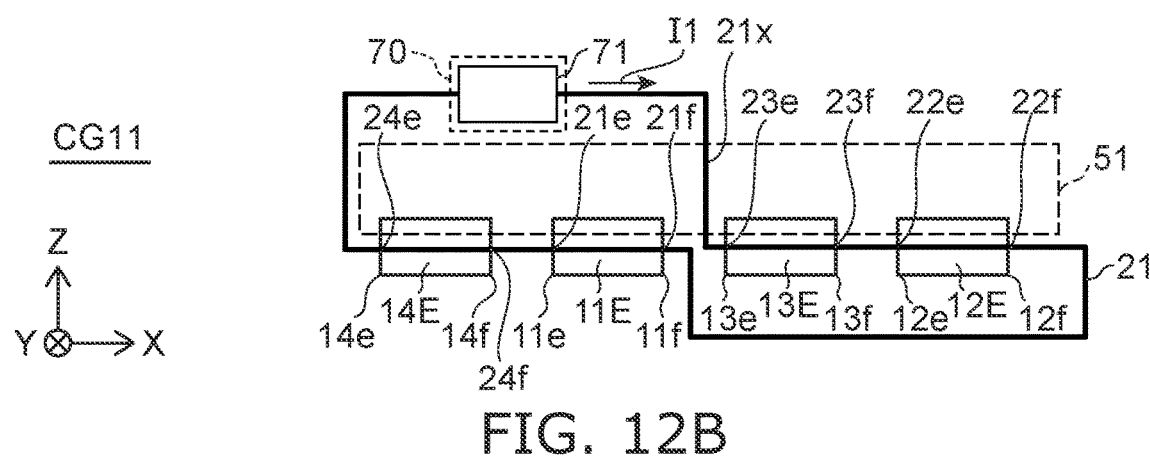

In the eleventh corresponding portion configuration CG11 as shown in FIG. 12B, the first to fourth corresponding portions 21 to 24 are electrically connected in series. In the eleventh corresponding portion configuration CG11, the first current I1 has the orientation described with reference to FIG. 6C.

Figure 12C:
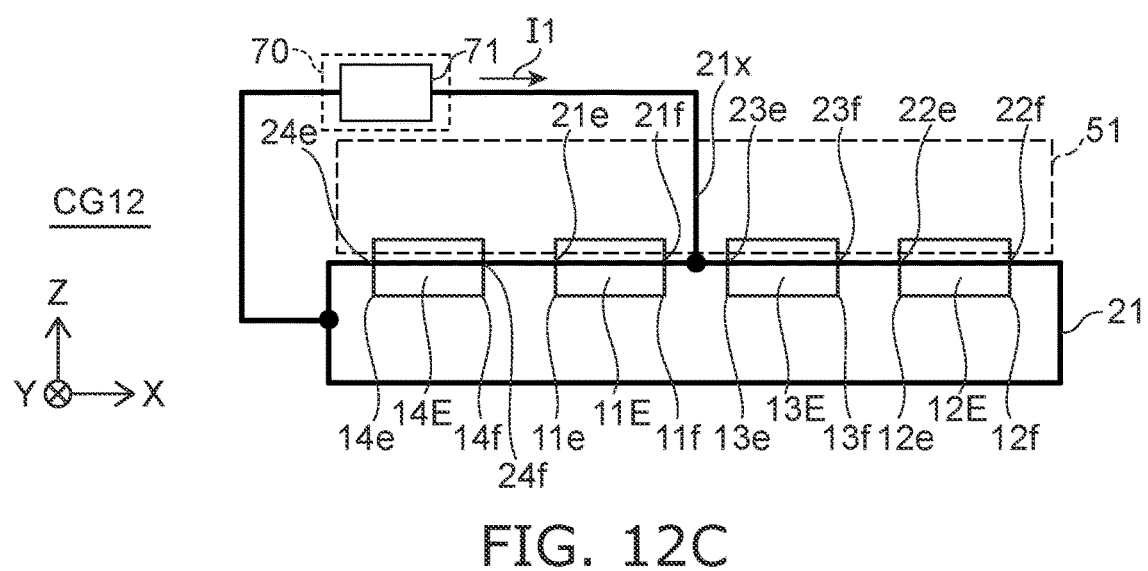

As shown in FIG. 12C, the twelfth corresponding portion configuration CG12 includes the first circuit that includes the first and fourth corresponding portions 21 and 24 that are connected in series. The second circuit that includes the second and third corresponding portions 22 and 23 that are connected in series is provided. The first circuit and the second circuit are electrically connected in parallel. In the twelfth corresponding portion configuration CG12, the first current I1 has the orientation described with reference to FIG. 6B. The sixth element configuration CF6 may be combined with one of the eleventh corresponding portion configuration CG11 or the twelfth corresponding portion configuration CG12.

In the first to sixth element configurations CF1 to CF6, the element current Id has the orientation described with reference to FIG. 5. In other words, the element current Id has the orientation from the one end portion 11Ee toward the other end portion 11Ef, the orientation from the one end portion 12Ee toward the other end portion 12Ef, the orientation from the one end portion 13Ee toward the other end portion 13Ef, and the orientation from the one end portion 14Ee toward the other end portion 14Ef.

As shown in FIGS. 7B, 7C, 8B, 8C, 9B, 9C, 10B, 10C, 11B, 11C, 12B, and 12C, a portion 21x of the conductive member 20 overlaps the magnetic member 51 in the first direction (the Y-axis direction). For example, the portion 21x of the conductive member 20 is between the base body 55 and the magnetic member 51 in the first direction (the Y-axis direction).

For example, the first connection member 15a is electrically connected with one of the other end portion 11Ef or the one end portion 11Ee of the first magnetic element 11E. The second connection member 15b is electrically connected with the other of the other end portion 11Ef or the one end portion 11Ee of the first magnetic element 11E. As shown in FIGS. 7A, 8A, 9A, 10A, 11A, and 12A, for example, the first connection member 15a overlaps the magnetic member 51 in the Y-axis direction. For example, the second connection member 15b does not overlap the magnetic member 51 in the Y-axis direction.

For example, the electrical resistances of the first to fourth magnetic elements 11E to 14E have substantially even-function characteristics with respect to the external magnetic field. For example, the electrical resistances have substantially even-function characteristics with respect to the current flowing through the conductive member 20 (the first to fourth corresponding portions 21 to 24). By applying an alternating magnetic by the first current I1 that includes the alternating current to the magnetic elements that have even-function characteristics, detection with higher sensitivity is possible as described below.

An example of the change of the electrical resistance of a magnetic element (the first magnetic element 11E) when a current flows in the conductive member 20 will now be described. The electrical resistance of the first magnetic element 11E will now be described. The following description is applicable to the second to fourth magnetic elements 12E to 14E.

Figure 13A:
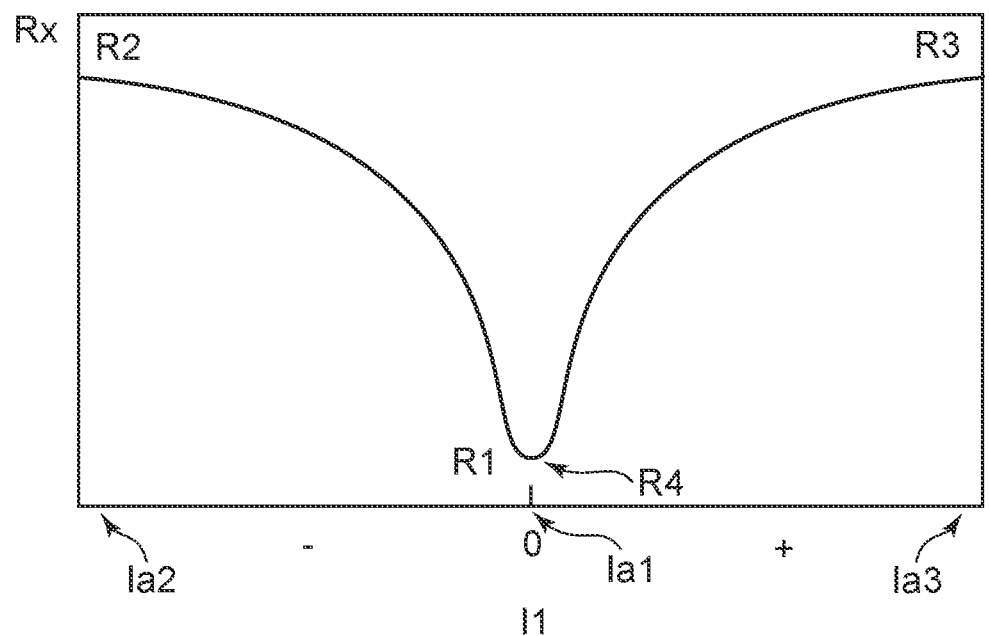
FIGS. 13A and 13B are schematic views illustrating characteristics of the magnetic sensor according to the first embodiment.
Figure 13B:
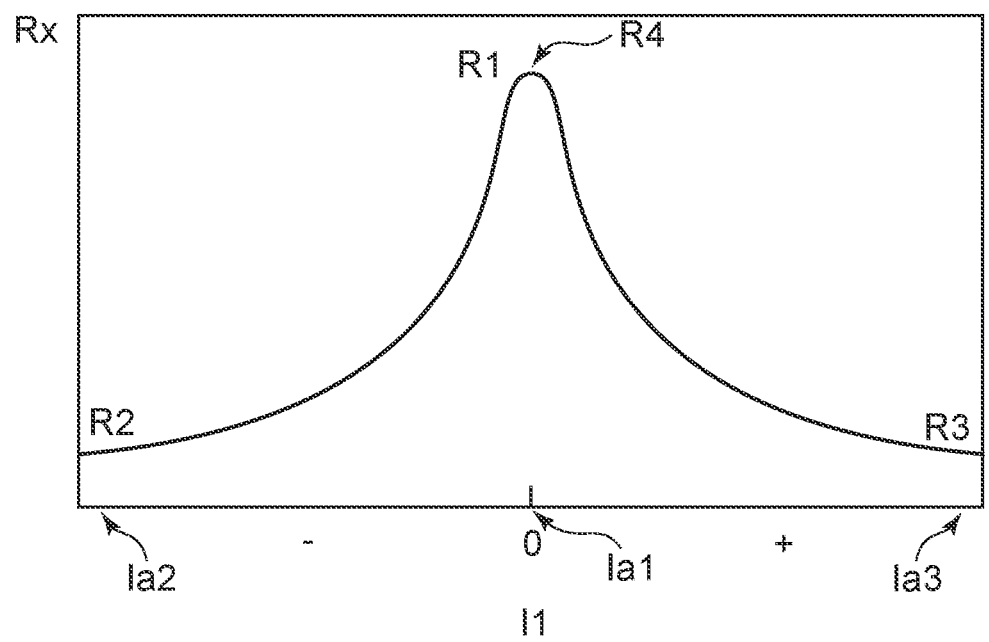

FIGS. 13A and 13B are schematic views illustrating characteristics of the magnetic sensor according to the first embodiment.

In these figures, the horizontal axis corresponds to the value of the current (e.g., the first current I1) flowing in the conductive member 20 (e.g., the first corresponding portion 21). The vertical axis is an electrical resistance Rx of the first magnetic element 11E. According to the embodiment as shown in FIGS. 13A and 13B, the electrical resistance Rx has an even-function characteristic with respect to the change of the current (the first current I1).

For example, the electrical resistance Rx of the first magnetic element 11E has a first value R1 when a first-value current Ia1 is supplied to the first corresponding portion 21. The electrical resistance Rx has a second value R2 when a second-value current Ia2 is supplied to the first corresponding portion 21. The electrical resistance Rx has a third value R3 when a third-value current Ia3 is supplied to the first corresponding portion 21. The absolute value of the first-value current Ia1 is less than the absolute value of the second-value current Ia2 and less than the absolute value of the third-value current Ia3. For example, the first-value current Ia1 may be substantially 0. The orientation of the second-value current Ia2 is opposite to the orientation of the third-value current Ia3.

In the example of FIG. 13A, the first value R1 is less than the second value R2 and less than the third value R3. In the example of FIG. 13A, the electrical resistance Rx has a "valley-like" characteristic. The first value R1 is, for example, the minimum value of the electrical resistance. In the example of FIG. 13B, the first value R1 is greater than the second value R2 and greater than the third value R3. In the example of FIG. 13B, the electrical resistance Rx has a "hill-like" characteristic. The first value R1 is, for example, the maximum value of the electrical resistance.

For example, when the external magnetic field is substantially 0, the magnetization of the first magnetic layer 11 and the magnetization of the first counter magnetic layer 11o have "parallel alignment"; for example, a "valley-like" characteristic is obtained due to the effect of interlayer magnetic coupling. In such a case, for example, the thickness of the first nonmagnetic layer 11n is not less than 2.5 nm. For example, when the external magnetic field is substantially 0, the magnetization of the first magnetic layer 11 and the magnetization of the first counter magnetic layer 11o have "antiparallel alignment"; for example, a "hill-like" characteristic is obtained due to the effect of interlayer magnetic coupling. In such a case, the thickness of the first nonmagnetic layer 11n is, for example, not less than 1.9 nm and not more than 2.1 nm.

For example, when a current does not flow in the first corresponding portion 21, the electrical resistance Rx has a fourth value R4. For example, the first value R1 is substantially equal to the fourth value R4 when the current does not flow. For example, the ratio of the absolute value of the difference between the first value R1 and the fourth value R4 to the fourth value R4 is not more than 0.01. The ratio may be not more than 0.001. A substantially even-function characteristic with respect to the positive and negative current is obtained.

Such a relationship between the first current I1 and the electrical resistance Rx is caused since the magnetic field from the first current I1 is applied to the first magnetic element 11E and the electrical resistance Rx of the first magnetic element 11E is changed according to the intensity of the magnetic field.

When an external magnetic field is applied to the first magnetic element 11E, the electrical resistance Rx also shows an even-function characteristic as shown in FIG. 13A or FIG. 13B. The external magnetic field includes, for example, a component along the Z-axis direction.

Figure 14A:
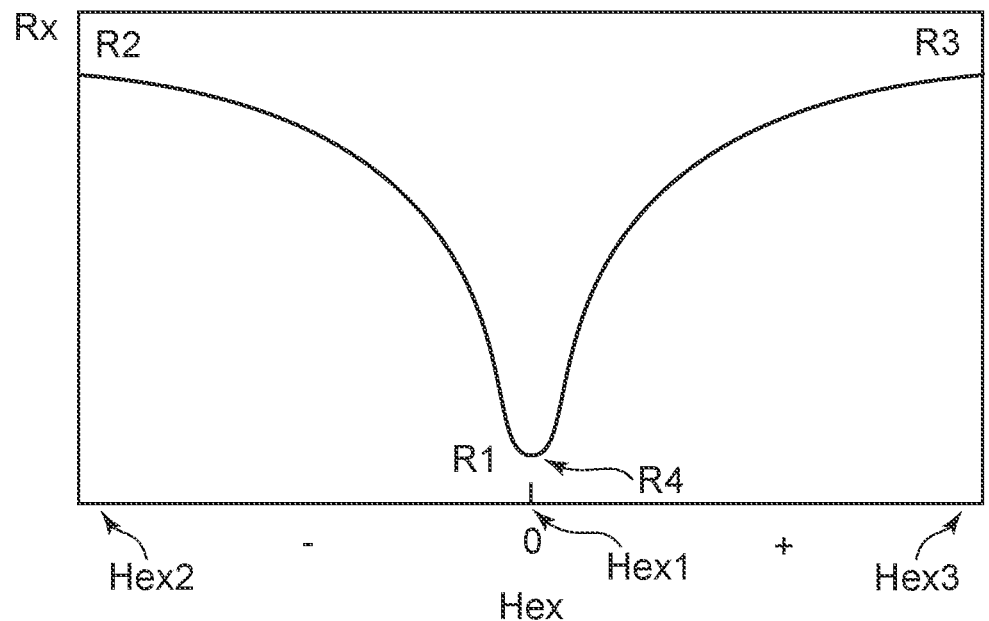
FIGS. 14A and 14B are schematic views illustrating characteristics of the magnetic sensor according to the first embodiment.
Figure 14B:
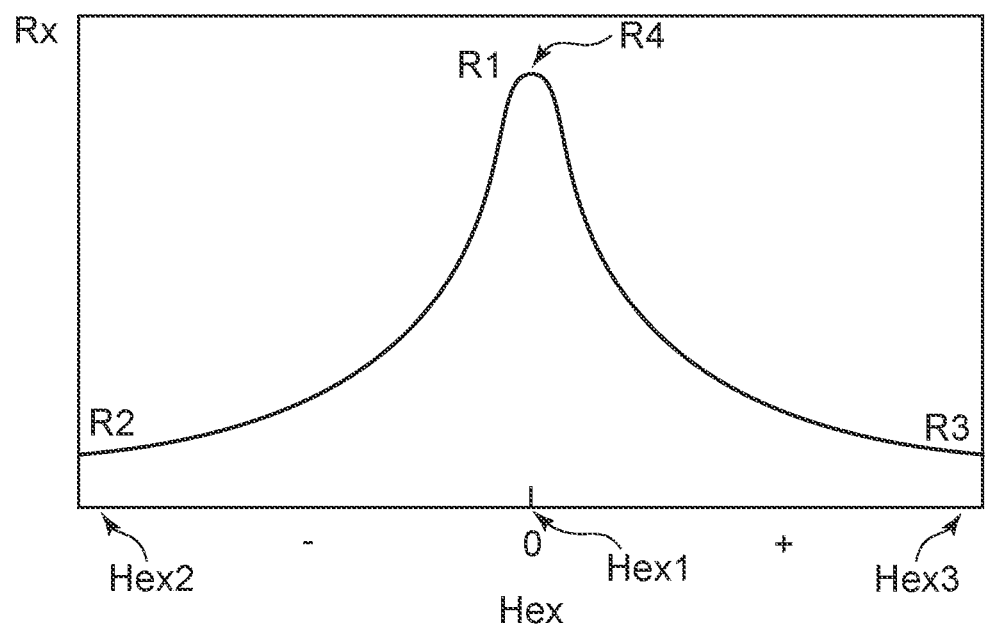

FIGS. 14A and 14B are schematic views illustrating characteristics of the magnetic sensor according to the first embodiment.

In these figures, the horizontal axis is the intensity of an external magnetic field Hex that is applied to the first magnetic element 11E. The vertical axis is the electrical resistance Rx of the first magnetic element 11E. These figures correspond to the R-H characteristic. As shown in FIGS. 14A and 14B, the electrical resistance Rx has an even-function characteristic with respect to the magnetic field (the external magnetic field Hex, e.g., a magnetic field in the Z-axis direction) that is applied to the first magnetic element 11E.

As shown in FIGS. 14A and 14B, the electrical resistance Rx of the first magnetic element 11E has the first value R1 when a first magnetic field Hex1 is applied to the first magnetic element 11E. The electrical resistance Rx has the second value R2 when a second magnetic field Hex2 is applied to the first magnetic element 11E. The electrical resistance Rx has the third value R3 when a third magnetic field Hex3 is applied to the first magnetic element 11E. The absolute value of the first magnetic field Hex1 is less than the absolute value of the second magnetic field Hex2 and less than the absolute value of the third magnetic field Hex3. The orientation of the second magnetic field Hex2 is opposite to the orientation of the third magnetic field Hex3.

In the example of FIG. 14A, the first value R1 is less than the second value R2 and less than the third value R3. In the example of FIG. 14B, the first value R1 is greater than the second value R2 and greater than the third value R3. For example, the electrical resistance Rx has the fourth value R4 when the external magnetic field is not applied to the first magnetic element 11E. The first value R1 is substantially equal to the fourth value R4 when the external magnetic field is not applied. For example, the ratio of the absolute value of the difference between the first value R1 and the fourth value R4 to the fourth value R4 is not more than 0.01. The ratio may be not more than 0.001. A substantially even-function characteristic is obtained for the positive and negative external magnetic fields.

By utilizing such an even-function characteristic, highly-sensitive detection is possible as follows.

An example will now be described in which the first current I1 is an alternating current and substantially does not include a direct current component. The first current I1 (the alternating current) is supplied to the first corresponding portion 21; and an alternating magnetic field due to the alternating current is applied to the first magnetic element 11E. An example of the change of the electrical resistance Rx at this time will now be described.

Figure 15A:
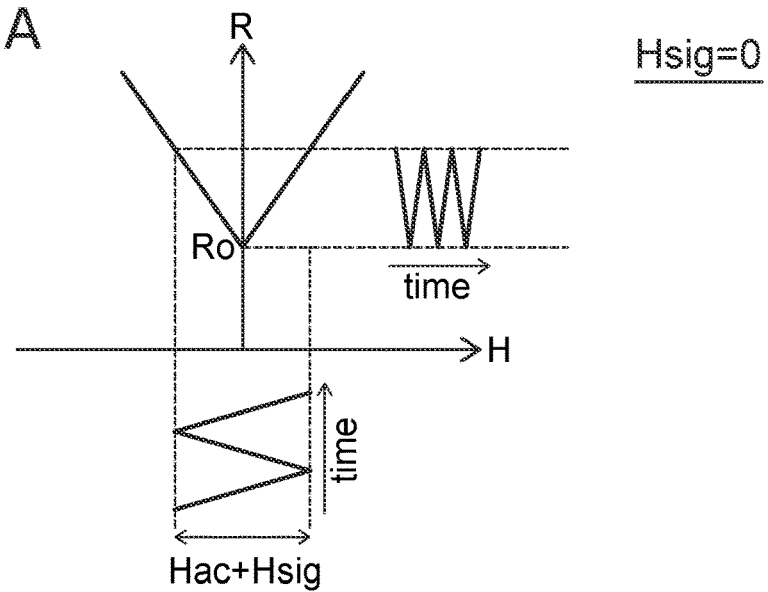
FIGS. 15A to 15C are graphs illustrating characteristics of the magnetic sensor according to the first embodiment.
Figure 15B:
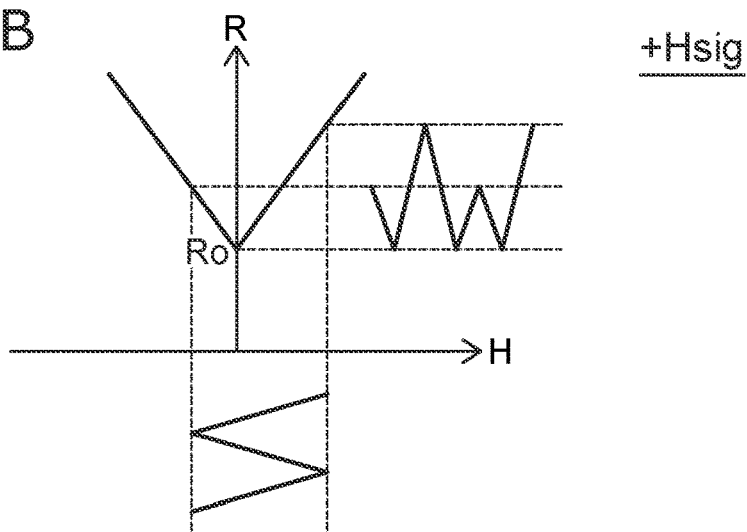
Figure 15C:
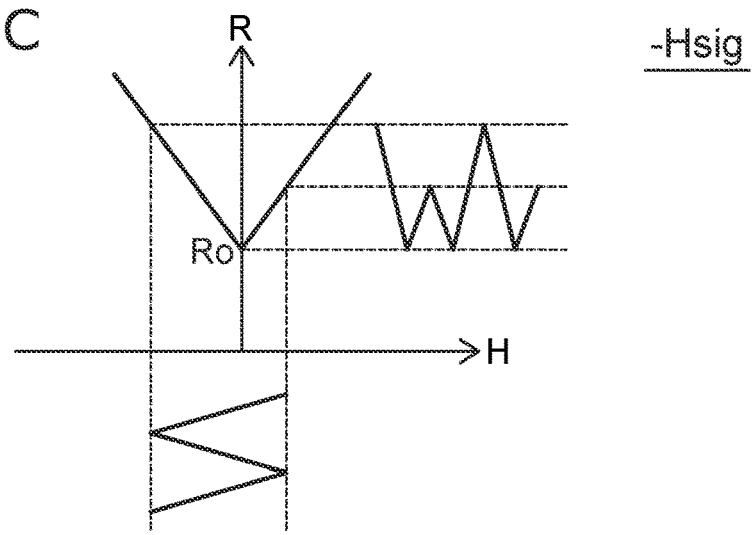

FIGS. 15A to 15C are graphs illustrating characteristics of the magnetic sensor according to the first embodiment.

FIG. 15A shows characteristics when a signal magnetic field Hsig (an external magnetic field) applied to the first magnetic element 11E is 0. FIG. 15B shows characteristics when the signal magnetic field Hsig is positive. FIG. 15C shows characteristics when the signal magnetic field Hsig is negative. These figures show the relationship between a magnetic field H and a resistance R (corresponding to the electrical resistance Rx).

As shown in FIG. 15A, when the signal magnetic field Hsig is 0, the resistance R has a characteristic that is symmetric with respect to the positive and negative magnetic field H. When an alternating magnetic field Hac is zero, the resistance R is a low resistance Ro. For example, the magnetization of the free magnetic layer (a first magnetic layer 11 and/or a first counter magnetic layer 11o,) is rotated substantially identically to the positive and negative magnetic field H. Therefore, a symmetric resistance change is obtained. The change of the resistance R with respect to the alternating magnetic field Hac has the same value between the positive and negative polarities. The period of the change of the resistance R is ½ times the period of the alternating magnetic field Hac. The change of the resistance R substantially does not include the frequency component of the alternating magnetic field Hac.

As shown in FIG. 15B, the characteristic of the resistance R shifts to the positive magnetic field H side when a positive signal magnetic field Hsig is applied. For example, the resistance R becomes high for the alternating magnetic field Hac on the positive side. The resistance R becomes low for the alternating magnetic field Hac on the negative side.

As shown in FIG. 15C, the characteristic of the resistance R shifts to the negative magnetic field H side when a negative signal magnetic field Hsig is applied. For example, the resistance R becomes low for the alternating magnetic field Hac on the positive side. The resistance R becomes high for the alternating magnetic field Hac on the negative side.

When a signal magnetic field Hsig with non-zero magnitude is applied, the deviation in the resistance R is generated. The deviation is different for the positive and negative portion of the alternating magnetic field Hac. The period of the deviation is equal to the period of the alternating magnetic field Hac. An output voltage which has the same frequency component as that of Hac corresponding to the deviation. An output voltage that has a frequency component of Hac corresponding to the signal magnetic field Hsig.

The characteristics described above are obtained in the case where the signal magnetic field Hsig does not temporally change. The case where the signal magnetic field Hsig temporally changes is as follows. The frequency of the signal magnetic field Hsig is taken as a signal frequency fsig. The frequency of the alternating magnetic field Hac is taken as an alternating current frequency fac. In such a case, an output that corresponds to the signal magnetic field Hsig is generated at the frequency of fac±fsig.

In the case where the signal magnetic field Hsig temporally changes, the signal frequency fsig is, for example, not more than 1 kHz. On the other hand, the alternating current frequency fac is sufficiently greater than the signal frequency fsig. For example, the alternating current frequency fac is not less than 10 times the signal frequency fsig.

For example, the signal magnetic field Hsig can be detected with high accuracy by extracting an output voltage having the same period (frequency) component (alternating current frequency component) as the period (the frequency) of the alternating magnetic field Hac. In the magnetic sensor 112 according to the embodiment, the external magnetic field Hex (the signal magnetic field Hsig) can be detected with high sensitivity. According to the embodiment, the external magnetic field Hex (the signal magnetic field Hsig) and the alternating magnetic field Hac due to the first current I1 can be efficiently applied to the first magnetic element 11E by the magnetic member 51. High sensitivity is obtained.

Figures 16A, 16B:
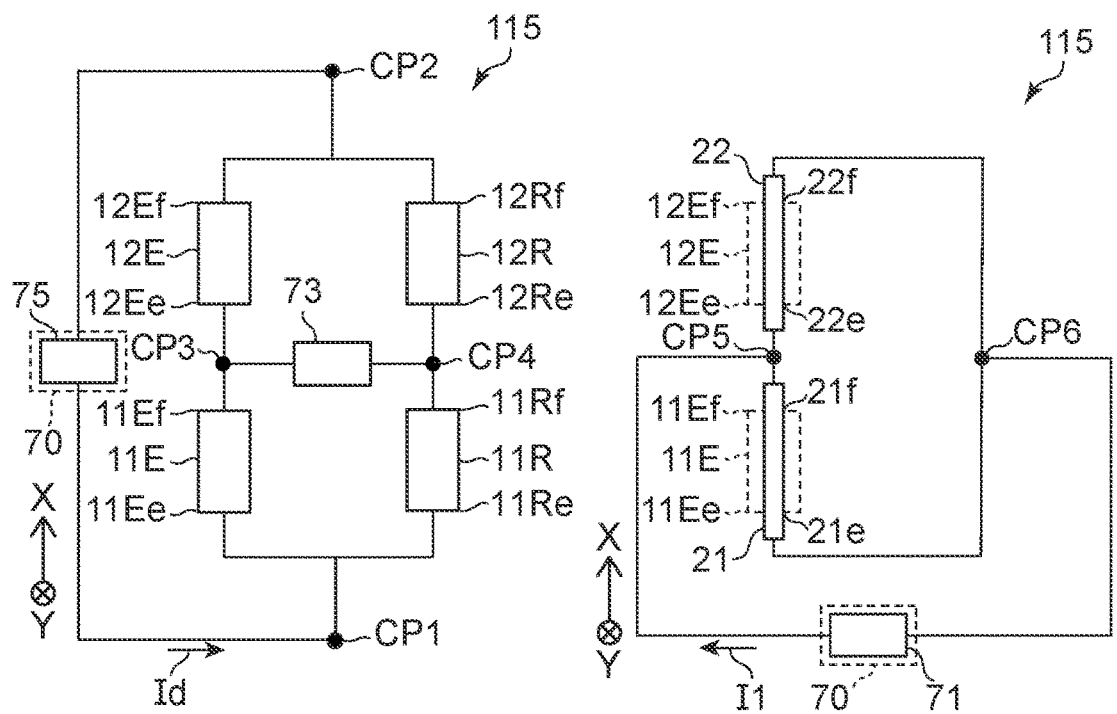
FIGS. 16A and 16B are schematic views illustrating a magnetic sensor according to the first embodiment.

FIGS. 16A and 16B are schematic views illustrating a magnetic sensor according to the first embodiment.

In the magnetic sensor 115 according to the embodiment as shown in FIG. 16A, the element part 10U includes the first magnetic element 11E, the second magnetic element 12E, a first resistance element 11R, and a second resistance element 12R. Otherwise, the configuration of the magnetic sensor 115 may be, for example, the same as those of the magnetic sensor 110, etc. For example, the magnetic sensor 115 also includes the base body 55, the magnetic member 51, and the element part 10U.

In the magnetic sensor 115, the one end portion 11Ee of the first magnetic element 11E is electrically connected with one end portion 11Re of the first resistance element 11R. The other end portion 11Ef of the first magnetic element 11E is electrically connected with the one end portion 12Ee of the second magnetic element 12E. Another end portion 11Rf of the first resistance element 11R is electrically connected with one end portion 12Re of the second resistance element 12R. The other end portion 12Ef of the second magnetic element 12E is electrically connected with another end portion 12Rf of the second resistance element 12R.

The element current circuit 75 is configured to supply the element current Id between the first connection point CP1 and the second connection point CP2, in which the first connection point CP1 is between the one end portion 11Ee of the first magnetic element 11E and the one end portion 11Re of the first resistance element 11R, and the second connection point CP2 is between the other end portion 12Ef of the second magnetic element 12E and the other end portion 12Rf of the second resistance element 12R.

The detection circuit 73 is configured to detect the change of the potential between the third connection point CP3 and the fourth connection point CP4, in which the third connection point CP3 is between the other end portion 11Ef of the first magnetic element 11E and the one end portion 12Ee of the second magnetic element 12E, and the fourth connection point CP4 is between the other end portion 11Rf of the first resistance element 11R and the one end portion 12Re of the second resistance element 12R.

As shown in FIG. 16B, the first corresponding other-portion 21f is electrically connected with the second corresponding one-portion 22e. The first corresponding one-portion 21e is electrically connected with the second corresponding other-portion 22f. The first current circuit 71 is configured to supply the first current I1 that includes the alternating current between the fifth connection point CP5 and the sixth connection point CP6, in which the fifth connection point CP5 is between the first corresponding other-portion 21f and the second corresponding one-portion 22e, and the sixth connection point CP6 is between the first corresponding one-portion 21e and the second corresponding other-portion 22f.

Second Embodiment

A second embodiment relates to an inspection device. As described below, the inspection device may include a diagnostic device.

Figure 17:
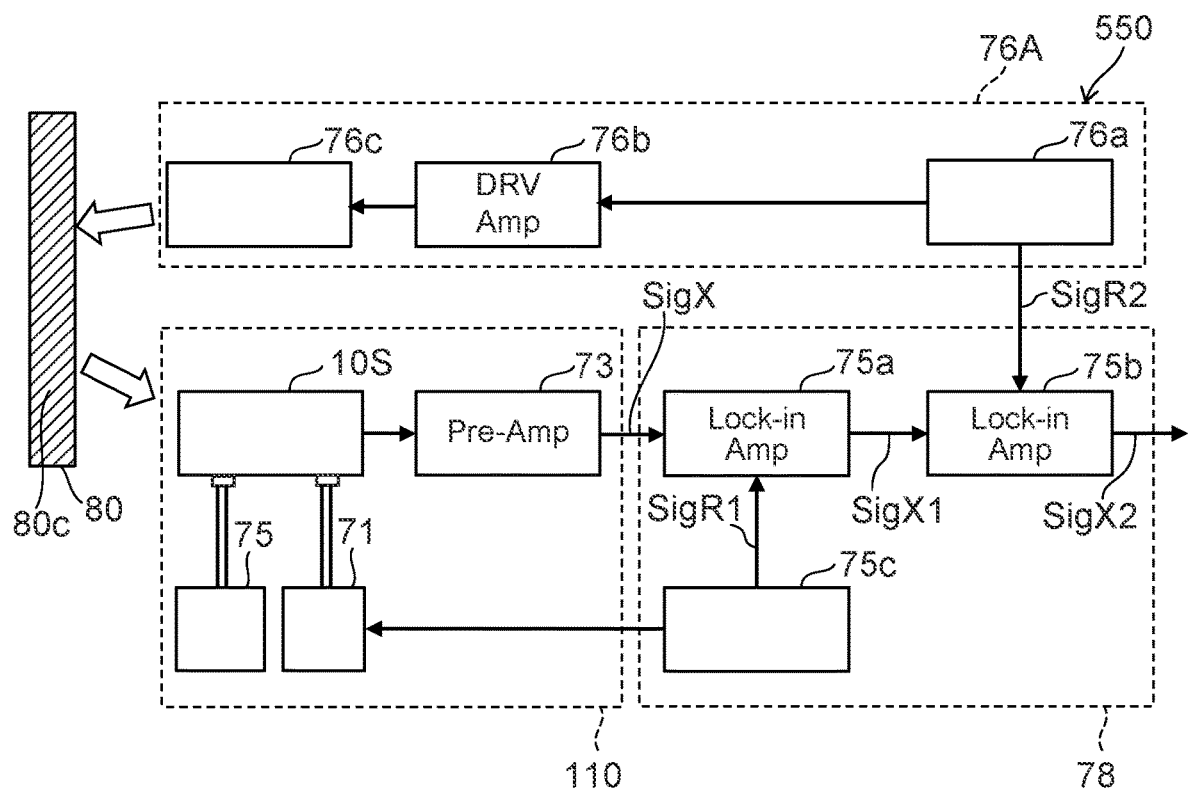
FIG. 17 is a schematic view illustrating an inspection device according to a second embodiment.

FIG. 17 is a schematic view illustrating the inspection device according to the second embodiment.

As shown in FIG. 17, the inspection device 550 according to the embodiment includes a processor 78 and the magnetic sensor (in the example of FIG. 17, the magnetic sensor 110) according to the embodiment. The processor 78 processes an output signal SigX obtained from the magnetic sensor 110. In the example, the processor 78 includes a sensor control circuit part 75c, a first lock-in amplifier 75a, and a second lock-in amplifier 75b. For example, the first current circuit 71 is controlled by the sensor control circuit part 75c; and the first current I1 that includes the alternating current component is supplied from the first current circuit 71 to a sensor part 10S. The frequency of the alternating current component of the first current I1 is, for example, not more than 100 kHz. The element current Id is supplied from the element current circuit 75 to the sensor part 10S. The sensor part 10S includes, for example, the element part 10U. The change of the potential of the sensor part 10S is detected by the detection circuit 73. For example, the output of the detection circuit 73 is the output signal SigX.

In the example, the inspection device 550 includes a magnetic field application part 76A. The magnetic field application part 76A is configured to apply a magnetic field to the detection object 80. The detection object 80 is, for example, the inspection object. The detection object 80 includes at least the inspection conductive member 80c such as a metal, etc. For example, an eddy current is generated in the inspection conductive member 80c when the magnetic field due to the magnetic field application part 76A is applied to the inspection conductive member 80c. The state of the eddy current changes when there is a flaw or the like in the inspection conductive member 80c. The state (e.g., the flaw, etc.) of the inspection conductive member 80c can be inspected by the magnetic sensor (e.g., the magnetic sensor 110, etc.) detecting the magnetic field due to the eddy current. The magnetic field application part 76A is, for example, an eddy current generator.

In the example, the magnetic field application part 76A includes an application control circuit part 76a, a drive amplifier 76b, and a coil 76c. A current is supplied to the drive amplifier 76b by the control by the application control circuit part 76a. The current is, for example, an alternating current. The frequency of the current is, for example, an eddy current excitation frequency. The eddy current excitation frequency is, for example, not less than 10 Hz and not more than 100 kHz. The eddy current excitation frequency may be, for example, less than 100 kHz.

For example, information (which may be, for example, a signal) that relates to the frequency of the alternating current component of the first current I1 is supplied from the sensor control circuit part 75c to the first lock-in amplifier 75a as a reference signal. The output of the first lock-in amplifier 75a is supplied to the second lock-in amplifier 75b. Information (which may be, for example, a signal) that relates to the eddy current excitation frequency is supplied from the application control circuit part 76a to the second lock-in amplifier 75b as a reference signal. The second lock-in amplifier 75b is configured to output a signal component corresponding to the eddy current excitation frequency.

Thus, for example, the processor 78 includes the first lock-in amplifier 75a. The output signal SigX that is obtained from the magnetic sensor 110 and a signal SigR1 that corresponds to the frequency of the alternating current component included in the first current I1 are input to the first lock-in amplifier 75a. The first lock-in amplifier 75a is configured to output an output signal SigX1 that uses the signal SigR1 corresponding to the frequency of the alternating current component included in the first current I1 as a reference wave (a reference signal). By providing the first lock-in amplifier 75a, it is possible to suppress noise and detect with high sensitivity.

The processor 78 may further include the second lock-in amplifier 75b. The output signal SigX1 of the first lock-in amplifier 75a and a signal SigR2 that corresponds to the frequency (the eddy current excitation frequency) of the supply signal (in the example, the magnetic field due to the magnetic field application part 76A) supplied toward the detection object 80 (the inspection object) are input to the second lock-in amplifier 75b. The second lock-in amplifier 75b is configured to output an output signal SigX2 that uses the signal SigR2 corresponding to the frequency of the supply signal supplied toward the detection object 80 (the inspection object) as a reference signal. By providing the second lock-in amplifier 75b, it is possible to further suppress noise and detect with even higher sensitivity.

A defect such as a flaw or the like of the inspection conductive member 80c of the detection object 80 can be inspected by the inspection device 550.

Figure 18:
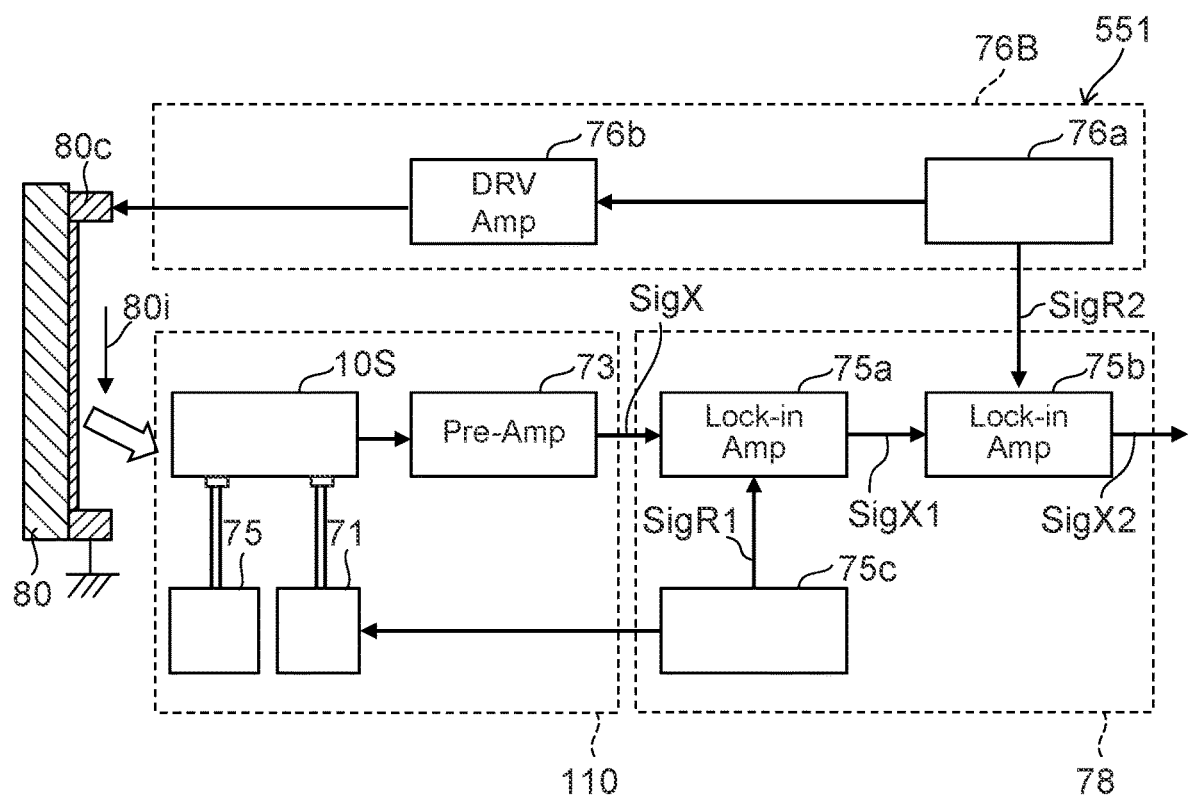
FIG. 18 is a schematic view illustrating an inspection device according to the second embodiment.

FIG. 18 is a schematic view illustrating an inspection device according to the second embodiment.

As shown in FIG. 18, the inspection device 551 according to the embodiment includes the processor 78 and the magnetic sensor (e.g., the magnetic sensor 110) according to the embodiment. The configurations of the magnetic sensor and the processor 78 of the inspection device 551 may be similar to those of the inspection device 550. In the example, the inspection device 551 includes a detection object driver 76B. The detection object driver 76B is configured to supply a current to the inspection conductive member 80c included in the detection object 80. The inspection conductive member 80c is, for example, wiring included in the detection object 80. A magnetic field that is due to a current 80i flowing in the inspection conductive member 80c is detected by the magnetic sensor 110. The inspection conductive member 80c can be inspected based on an abnormality due to the detection result of the magnetic sensor 110. The detection object 80 may be, for example, an electronic device such as a semiconductor device, etc. The detection object 80 may be, for example, a battery, etc.

In the example, the detection object driver 76B includes the application control circuit part 76a and the drive amplifier 76b. The drive amplifier 76b is controlled by the application control circuit part 76*a*; and a current is supplied from the drive amplifier 76*b* to the inspection conductive member 80*c*. The current is, for example, an alternating current. For example, the alternating current is supplied to the inspection conductive member 80*c*. The frequency of the alternating current is, for example, not less than 10 Hz and not more than 100 kHz. The frequency may be, for example, less than 100 kHz. In the example as well, for example, by providing the first lock-in amplifier 75*a* and the second lock-in amplifier 75*b*, it is possible to suppress noise and detect with high sensitivity. In one example of the inspection device 551, multiple magnetic sensors (e.g., the multiple magnetic sensors 110) may be provided. The multiple magnetic sensors are, for example, a sensor array. The inspection conductive member 80*c* can be inspected in a short period of time by the sensor array. In one example of the inspection device 551, the inspection conductive member 80*c* may be inspected by scanning the magnetic sensor (e.g., the magnetic sensor 110).

Figure 19:
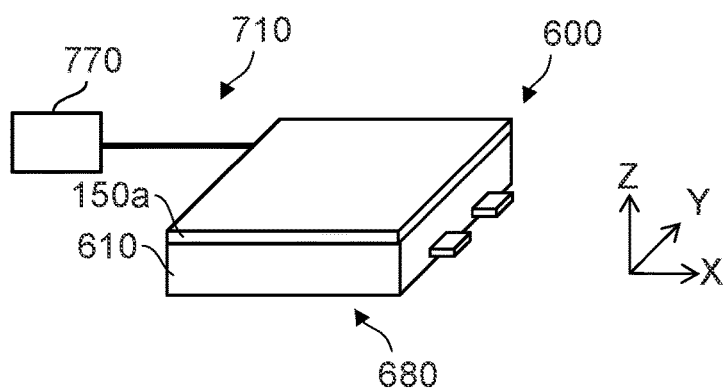
FIG. 19 is a schematic perspective view showing an inspection device according to the second embodiment.

FIG. 19 is a schematic perspective view showing an inspection device according to the second embodiment.

As shown in FIG. 19, the inspection device 710 according to the embodiment includes a magnetic sensor 150*a* and a processor 770. The magnetic sensor 150*a* may be any magnetic sensor according to the first or second embodiment or a modification of the magnetic sensor. The processor 770 processes an output signal obtained from the magnetic sensor 150*a*. The processor 770 may perform a comparison between a reference value and the signal obtained from the magnetic sensor 150*a*, etc. The processor 770 is configured to output an inspection result based on the processing result.

For example, an inspection object 680 is inspected by the inspection device 710. The inspection object 680 is, for example, an electronic device (including a semiconductor circuit, etc.). The inspection object 680 may be, for example, a battery 610, etc.

For example, the magnetic sensor 150*a* according to the embodiment may be used together with the battery 610. For example, a battery system 600 includes the battery 610 and the magnetic sensor 150*a*. The magnetic sensor 150*a* can detect a magnetic field generated by a current flowing in the battery 610.

Figure 20:
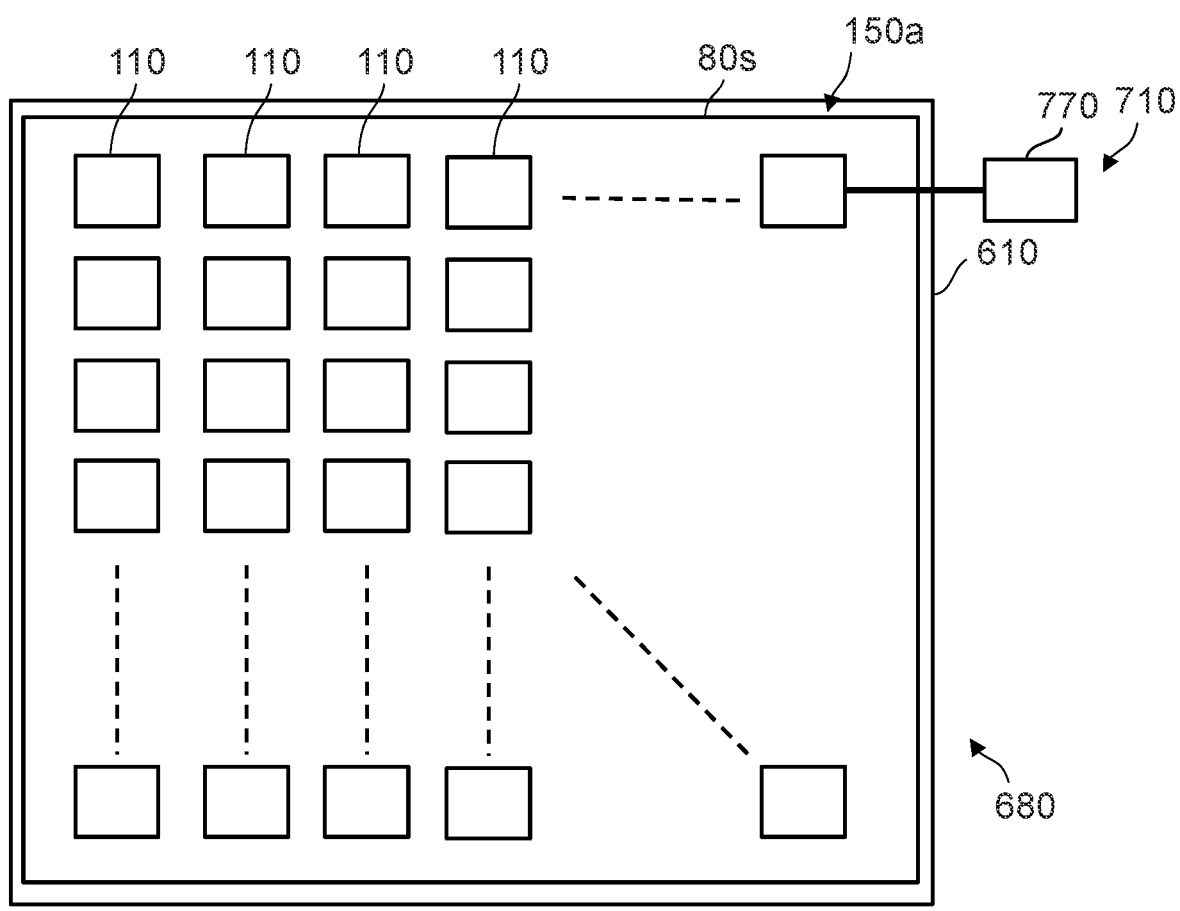
FIG. 20 is a schematic plan view showing the inspection device according to the second embodiment.

FIG. 20 is a schematic plan view showing the inspection device according to the second embodiment.

As shown in FIG. 20, the magnetic sensor 150*a* includes, for example, multiple magnetic sensors according to the embodiment. In the example, the magnetic sensor 150*a* includes multiple magnetic sensors (e.g., the magnetic sensor 110, etc.). For example, the multiple magnetic sensors are arranged along two directions. For example, the multiple magnetic sensors 110 are located on a base body.

The magnetic sensor 150*a* can detect a magnetic field generated by a current flowing in the inspection object 680 (which may be, for example, the battery 610). For example, an abnormal current flows in the battery 610 when the battery 610 approaches an abnormal state. The change of the state of the battery 610 can be known by the magnetic sensor 150*a* detecting the abnormal current. For example, the entire battery 610 can be inspected in a short period of time by moving the sensor array in two directions while the magnetic sensor 150*a* is placed proximate to the battery 610. The magnetic sensor 150*a* may be used to inspect the battery 610 in the manufacturing process of the battery 610.

Figure 21:
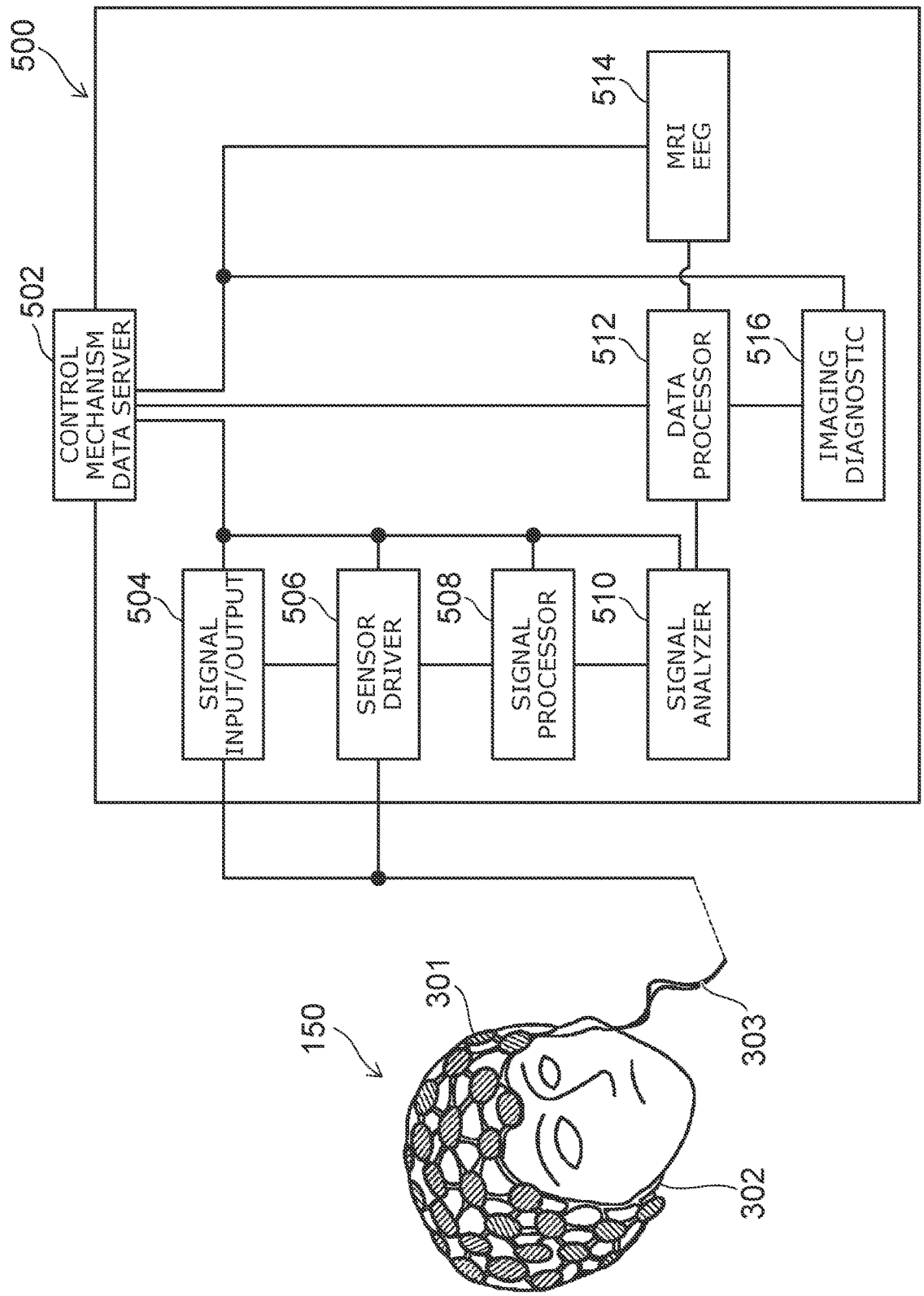
FIG. 21 is a schematic view showing the magnetic sensor and the inspection device according to the second embodiment.

For example, the magnetic sensor according to the embodiment is applicable to the inspection device 710 such as a diagnostic device, etc. FIG. 21 is a schematic view showing the magnetic sensor and the inspection device according to the second embodiment.

As shown in FIG. 21, the diagnostic device 500 is an example of the inspection device 710 and includes the magnetic sensor 150. The magnetic sensor 150 includes the magnetic sensor described in reference to the first and second embodiments and modifications of the magnetic sensor.

In the diagnostic device 500, the magnetic sensor 150 is, for example, a magnetoencephalography device. The magnetoencephalography device detects a magnetic field generated by cranial nerves. When the magnetic sensor 150 is included in a magnetoencephalography device, the size of the magnetic element included in the magnetic sensor 150 is, for example, not less than 1 mm but less than 10 mm. The size is, for example, the length including the MFC.

As shown in FIG. 21, the magnetic sensor 150 (the magnetoencephalography device) is mounted to, for example, the head of a human body. The magnetic sensor 150 (the magnetoencephalography device) includes a sensor part 301. The magnetic sensor 150 (the magnetoencephalography device) may include multiple sensor parts 301. The number of the multiple sensor parts 301 is, for example, about 100 (e.g., not less than 50 and not more than 150). The multiple sensor parts 301 are provided on a flexible base body 302.

The magnetic sensor 150 may include, for example, a circuit for differential detection, etc. The magnetic sensor 150 may include a sensor other than a magnetic sensor (e.g., a potential terminal, an acceleration sensor, etc.).

The size of the magnetic sensor 150 is small compared to the size of a conventional SQUID magnetic sensor. Therefore, the mounting of the multiple sensor parts 301 is easy. The mounting of the multiple sensor parts 301 and the other circuits is easy. The multiple sensor parts 301 and the other sensors can be easily mounted together.

The base body 302 may include, for example, an elastic body such as a silicone resin, etc. For example, the multiple sensor parts 301 are linked to each other and provided in the base body 302. For example, the base body 302 can be closely adhered to the head.

An input/output cord 303 of the sensor part 301 is connected with a sensor driver 506 and a signal input/output part 504 of the diagnostic device 500. A magnetic field measurement is performed in the sensor part 301 based on electrical power from the sensor driver 506 and a control signal from the signal input/output part 504. The result is input to the signal input/output part 504. The signal that is obtained by the signal input/output part 504 is supplied to a signal processor 508. Processing such as, for example, the removal of noise, filtering, amplification, signal calculation, etc., are performed in the signal processor 508. The signal that is processed by the signal processor 508 is supplied to a signal analyzer 510. For example, the signal analyzer 510 extracts a designated signal for magnetoencephalography. For example, signal analysis to match the signal phases is performed in the signal analyzer 510.

The output of the signal analyzer 510 (the data for which the signal analysis is finished) is supplied to a data processor 512. Data analysis is performed in the data processor 512. It is possible to include image data such as, for example, MRI (Magnetic Resonance Imaging), etc., in the data analysis. It is possible to include, for example, scalp potential information such as an EEG (Electroencephalogram), etc., in the data analysis. For example, a data part 514 of the MRI, the EEG, etc., is connected with the data processor 512. For example, nerve firing point analysis, inverse analysis, or the like is performed by the data analysis.

For example, the result of the data analysis is supplied to an imaging diagnostic part 516. Imaging is performed by the imaging diagnostic part 516. The diagnosis is supported by the imaging.

For example, the series of operations described above is controlled by a control mechanism 502. For example, necessary data such as preliminary signal data, metadata partway through the data processing, or the like is stored in a data server. The data server and the control mechanism may be integrated.

The diagnostic device 500 according to the embodiment includes the magnetic sensor 150, and a processor that processes the output signal obtained from the magnetic sensor 150. The processor includes, for example, at least one of the signal processor 508 or the data processor 512. The processor includes, for example, a computer, etc.

In the magnetic sensor 150 shown in FIG. 21, the sensor part 301 is mounted to the head of a human body. The sensor part 301 may be mounted to the chest of the human body. Magnetocardiography is possible thereby. For example, the sensor part 301 may be mounted to the abdomen of a pregnant woman. Palmoscopy of the fetus can be performed thereby.

It is favorable for the magnetic sensor device including the participant to be mounted inside a shielded room. For example, the effects of geomagnetism or magnetic noise can be suppressed thereby.

For example, a mechanism may be provided to locally shield the sensor part 301 or the measurement section of the human body. For example, a shield mechanism may be provided in the sensor part 301. For example, the signal analysis or the data processing may be effectively shielded.

According to the embodiment, the base body 302 may be flexible or may be substantially not flexible. In the example shown in FIG. 21, the base body 302 is a continuous membrane that is patterned into a hat-like configuration. The base body 302 may have a net configuration. For example, a good fit is obtained thereby. For example, the adhesion of the base body 302 to the human body is improved. The base body 302 may have a hard helmet-like configuration.

Figure 22:
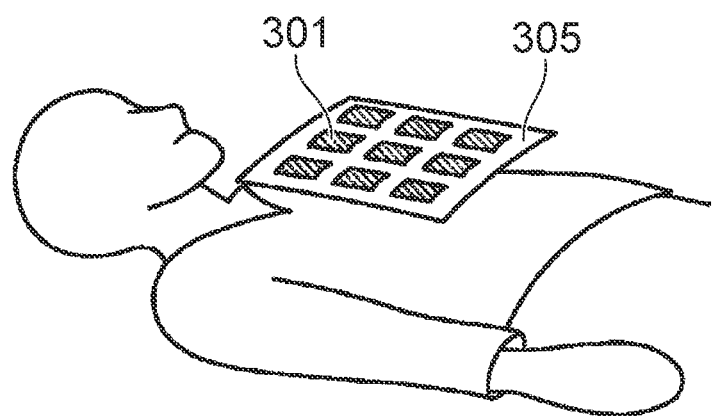
FIG. 22 is a schematic view showing the inspection device according to the second embodiment.

FIG. 22 is a schematic view showing the inspection device according to the second embodiment.

FIG. 22 is an example of a magnetocardiography device. In the example shown in FIG. 22, the sensor part 301 is provided on a hard base body 305 having a flat plate shape.

The input and output of the signal obtained from the sensor part 301 in the example shown in FIG. 22 is similar to the input and output described with reference to FIG. 21. The processing of the signal obtained from the sensor part 301 in the example shown in FIG. 22 is similar to the processing described with reference to FIG. 21.

There is a reference example in which a SQUID (Superconducting Quantum Interference Device) magnetic sensor is used as a device to measure a faint magnetic field such as a magnetic field emitted from a living body, etc. Because superconductivity is used in the reference example, the device is large; and the power consumption is large. The load on the measurement object (the patient) is large.

According to the embodiment, the device can be small. The power consumption can be suppressed. The load on the measurement object (the patient) can be reduced. According to the embodiment, the SN ratio of the magnetic field detection can be improved. The sensitivity can be increased.

Embodiments may include the following configurations (e.g., technological proposals).

Configuration 1

A magnetic sensor, comprising:
a base body including a base body end portion;
a magnetic member, a direction from the base body toward the magnetic member being along a first direction; and
an element part,
the element part including a first magnetic element and a second magnetic element,
an orientation from the first magnetic element toward the second magnetic element being along a second direction crossing the first direction,
a portion of the first magnetic element and a portion of the second magnetic element being between the base body and the magnetic member in the first direction,
a position in a third direction of an other portion of the first magnetic element and a position in the third direction of an other portion of the second magnetic element being between a position in the third direction of the base body end portion and a position in the third direction of the magnetic member,
the third direction crossing a plane including the first and second directions.

Configuration 2

The magnetic sensor according to Configuration 1, wherein
the element part further includes a first connection member,
the first connection member is electrically connected with one of one end portion or an other end portion of the first magnetic element, and
at least a portion of the first connection member is between the base body and the magnetic member in the first direction.

Configuration 3

The magnetic sensor according to Configuration 2, wherein
the element part further includes a second connection member,
the second connection member is electrically connected with the other of the one end portion or the other end portion of the first magnetic element, and
a position in the third direction of the second connection member is between the position in the third direction of the base body end portion and a position in the third direction of at least one of the first magnetic element or the second magnetic element.

Configuration 4

The magnetic sensor according to Configuration 3, wherein
at least a portion of the second magnetic element is between at least a portion of the second connection member in the third direction and at least a portion of the first connection member.

Configuration 5

The magnetic sensor according to Configuration 3 or 4, wherein
the element part further includes a conductive member, and
the conductive member includes:
a first corresponding portion corresponding to the first magnetic element; and
a second corresponding portion corresponding to the second magnetic element.

Configuration 6
  The magnetic sensor according to Configuration 5, wherein
  the other end portion of the first magnetic element is electrically connected with one end portion of the second magnetic element,
  an element current flows between the one end portion of the first magnetic element and an other end portion of the second magnetic element,
  the first corresponding portion includes:
    a first corresponding one-portion corresponding to the one end portion of the first magnetic element; and
    a first corresponding other-portion corresponding to the other end portion of the first magnetic element,
  the second corresponding portion includes:
    a second corresponding one-portion corresponding to the one end portion of the second magnetic element; and
    a second corresponding other-portion corresponding to the other end portion of the second magnetic element,
  at a first time at which a first current that includes an alternating current component is supplied to the conductive member:
    the element current flows through the first magnetic element in an orientation from the one end portion of the first magnetic element toward the other end portion of the first magnetic element;
    the element current flows through the second magnetic element in an orientation from the one end portion of the second magnetic element toward the other end portion of the second magnetic element;
    the first current flows through the first corresponding portion in an orientation from the first corresponding other-portion toward the first corresponding one-portion; and
    the first current flows through the second corresponding portion in an orientation from the second corresponding one-portion toward the second corresponding other-portion.

Configuration 7
  The magnetic sensor according to Configuration 3 or 4, wherein
  the element part further includes a third magnetic element, a fourth magnetic element, and a third connection member,
  an orientation from the first magnetic element toward the third magnetic element is along the second direction,
  an orientation from the first magnetic element toward the fourth magnetic element is along the second direction,
  the third connection member is electrically connected with one of the second magnetic element, the third magnetic element, or the fourth magnetic element, and
  at least a portion of the third connection member is between the base body and the magnetic member in the first direction.

Configuration 8
  The magnetic sensor according to Configuration 7, wherein
  the element part further includes a fourth connection member,
  the fourth connection member is electrically connected with one of the second magnetic element, the third magnetic element, or the fourth magnetic element, and
  a position in the third direction of the fourth connection member is between the position in the third direction of the base body end portion and a position in the third direction of the one of the second magnetic element, the third magnetic element, or the fourth magnetic element.

Configuration 9
  The magnetic sensor according to Configuration 7 or 8, wherein
  the element part further includes a conductive member, and
  the conductive member includes:
    a first corresponding portion corresponding to the first magnetic element;
    a second corresponding portion corresponding to the second magnetic element;
    a third corresponding portion corresponding to the third magnetic element; and
    a fourth corresponding portion corresponding to the fourth magnetic element.

Configuration 10
  The magnetic sensor according to Configuration 9, wherein
  the other end portion of the first magnetic element is electrically connected with one end portion of the second magnetic element,
  the one end portion of the first magnetic element is electrically connected with one end portion of the third magnetic element,
  an other end portion of the third magnetic element is electrically connected with one end portion of the fourth magnetic element,
  an other end portion of the second magnetic element is electrically connected with an other end portion of the fourth magnetic element,
  the first corresponding portion includes:
    a first corresponding one-portion corresponding to the one end portion of the first magnetic element; and
    a first corresponding other-portion corresponding to the other end portion of the first magnetic element,
  the second corresponding portion includes:
    a second corresponding one-portion corresponding to the one end portion of the second magnetic element; and
    a second corresponding other-portion corresponding to the other end portion of the second magnetic element,
  the third corresponding portion includes:
    a third corresponding one-portion corresponding to the one end portion of the third magnetic element; and
    a third corresponding other-portion corresponding to the other end portion of the third magnetic element,
  the fourth corresponding portion includes:
    a fourth corresponding one-portion corresponding to the one end portion of the fourth magnetic element; and
    a fourth corresponding other-portion corresponding to the other end portion of the fourth magnetic element,
  at a first time at which a first current that includes an alternating current component is supplied to the conductive member:
    an element current flows through the first magnetic element in an orientation from the one end portion of the first magnetic element toward the other end portion of the first magnetic element;
    the element current flows through the second magnetic element in an orientation from the one end portion of the second magnetic element toward the other end portion of the second magnetic element;
    the element current flows through the third magnetic element in an orientation from the one end portion of the third magnetic element toward the other end portion of the third magnetic element;

the element current flows through the fourth magnetic element in an orientation from the one end portion of the fourth magnetic element toward the other end portion of the fourth magnetic element;

the first current flows through the first corresponding portion in an orientation from the first corresponding other-portion toward the first corresponding one-portion;

the first current flows through the second corresponding portion in an orientation from the second corresponding one-portion toward the second corresponding other-portion;

the first current flows through the third corresponding portion in an orientation from the third corresponding one-portion toward the third corresponding other-portion; and the first current flows through the fourth corresponding portion in an orientation from the fourth corresponding other-portion toward the fourth corresponding one-portion.

Configuration 11

The magnetic sensor according to Configuration 9, wherein the other end portion of the first magnetic element is electrically connected with one end portion of the second magnetic element, the one end portion of the first magnetic element is electrically connected with one end portion of the third magnetic element, p1 an other end portion of the third magnetic element is electrically connected with one end portion of the fourth magnetic element, an other end portion of the second magnetic element is electrically connected with an other end portion of the fourth magnetic element, the first corresponding portion includes:
 a first corresponding one-portion corresponding to the one end portion of the first magnetic element; and
 a first corresponding other-portion corresponding to the other end portion of the first magnetic element, the second corresponding portion includes:
 a second corresponding one-portion corresponding to the one end portion of the second magnetic element; and
 a second corresponding other-portion corresponding to the other end portion of the second magnetic element, the third corresponding portion includes:
 a third corresponding one-portion corresponding to the one end portion of the third magnetic element; and
 a third corresponding other-portion corresponding to the other end portion of the third magnetic element, the fourth corresponding portion includes:
 a fourth corresponding one-portion corresponding to the one end portion of the fourth magnetic element; and
 a fourth corresponding other-portion corresponding to the other end portion of the fourth magnetic element, the first corresponding one-portion is electrically connected with the third corresponding one-portion, the first corresponding other-portion is electrically connected with the second corresponding one-portion, the third corresponding other-portion is electrically connected with the fourth corresponding one-portion, and the second corresponding other-portion is electrically connected with the fourth corresponding other-portion.

Configuration 12

The magnetic sensor according to Configuration 11, further comprising:

a first current circuit, the first current circuit being configured to supply the first current between a fifth connection point and a sixth connection point, the first current including an alternating current, the fifth connection point being between the first corresponding other-portion and the second corresponding one-portion, the sixth connection point being between the third corresponding other-portion and the fourth corresponding one-portion.

Configuration 13

The magnetic sensor according to Configuration 9, wherein the other end portion of the first magnetic element is electrically connected with one end portion of the second magnetic element, the one end portion of the first magnetic element is electrically connected with one end portion of the third magnetic element, an other end portion of the third magnetic element is electrically connected with one end portion of the fourth magnetic element, an other end portion of the second magnetic element is electrically connected with an other end portion of the fourth magnetic element, the first corresponding portion includes:
 a first corresponding one-portion corresponding to the one end portion of the first magnetic element; and
 a first corresponding other-portion corresponding to the other end portion of the first magnetic element, the second corresponding portion includes:
 a second corresponding one-portion corresponding to the one end portion of the second magnetic element; and
 a second corresponding other-portion corresponding to the other end portion of the second magnetic element, the third corresponding portion includes:
 a third corresponding one-portion corresponding to the one end portion of the third magnetic element; and
 a third corresponding other-portion corresponding to the other end portion of the third magnetic element, the fourth corresponding portion includes:
 a fourth corresponding one-portion corresponding to the one end portion of the fourth magnetic element; and
 a fourth corresponding other-portion corresponding to the other end portion of the fourth magnetic element, the first corresponding one-portion is electrically connected with the second corresponding other-portion, the first corresponding other-portion is electrically connected with the fourth corresponding one-portion, the third corresponding one-portion is electrically connected with the fourth corresponding other-portion, and the third corresponding other-portion is electrically connected with the second corresponding one-portion.

Configuration 14

The magnetic sensor according to Configuration 12, further comprising:

a first current circuit, the first current circuit being configured to supply the first current between a seventh connection point and an eighth connection point, the first current including an alternating current,
the seventh connection point being between the first corresponding one-portion and the second corresponding other-portion,
the eighth connection point being between the third corresponding one-portion and the fourth corresponding other-portion.

Configuration 15

The magnetic sensor according to Configuration 9, wherein
the other end portion of the first magnetic element is electrically connected with one end portion of the second magnetic element,
the one end portion of the first magnetic element is electrically connected with one end portion of the third magnetic element,
an other end portion of the third magnetic element is electrically connected with one end portion of the fourth magnetic element,
an other end portion of the second magnetic element is electrically connected with an other end portion of the fourth magnetic element,
the first corresponding portion includes:
  a first corresponding one-portion corresponding to the one end portion of the first magnetic element; and
  a first corresponding other-portion corresponding to the other end portion of the first magnetic element,
the second corresponding portion includes:
  a second corresponding one-portion corresponding to the one end portion of the second magnetic element; and
  a second corresponding other-portion corresponding to the other end portion of the second magnetic element,
the third corresponding portion includes:
  a third corresponding one-portion corresponding to the one end portion of the third magnetic element; and
  a third corresponding other-portion corresponding to the other end portion of the third magnetic element,
the fourth corresponding portion includes:
  a fourth corresponding one-portion corresponding to the one end portion of the fourth magnetic element; and
  a fourth corresponding other-portion corresponding to the other end portion of the fourth magnetic element,
the first corresponding other-portion is electrically connected with the fourth corresponding one-portion,
the fourth corresponding other-portion is electrically connected with the second corresponding other-portion, and
the second corresponding one-portion is electrically connected with the third corresponding other-portion.

Configuration 16

The magnetic sensor according to Configuration 15, further comprising:
a first current circuit,
the first current circuit being configured to supply the first current between the first corresponding one-portion and the third corresponding one-portion,
the first current including an alternating current.

Configuration 17

The magnetic sensor according to any one of Configurations 10 to 16, further comprising:
an element current circuit,
the element current circuit being configured to supply an element current between a first connection point and a second connection point,
the first connection point being between the one end portion of the first magnetic element and the one end portion of the third magnetic element,
the second connection point being between the other end portion of the second magnetic element and the other end portion of the fourth magnetic element.

Configuration 18

The magnetic sensor according to Configuration 17, further comprising:
a detection circuit,
the detection circuit being configured to detect a change of a potential between a third connection point and a fourth connection point,
the third connection point being between the other end portion of the first magnetic element and the one end portion of the second magnetic element,
the fourth connection point being between the other end portion of the third magnetic element and the one end portion of the fourth magnetic element.

Configuration 19

The magnetic sensor according to any one of Configurations 10 to 18, wherein
a portion of the conductive member overlaps the magnetic member in the first direction.

Configuration 20

The magnetic sensor according to any one of Configurations 1 to 19, wherein
a length along the third direction of the portion of the first magnetic element is not more than 0.4 times a length along the third direction of the first magnetic element.

Configuration 21

The magnetic sensor according to any one of Configurations 1 to 20, wherein
a ratio of a distance along the third direction between the base body end portion and the first magnetic element to the length along the third direction of the first magnetic element is not less than 1.5 times.

Configuration 22

An inspection device, comprising:
the magnetic sensor according to any one of Configurations 1 to 21; and
a processor configured to process a signal output from the magnetic sensor.

According to embodiments, a magnetic sensor and an inspection device can be provided in which the sensitivity can be increased.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in magnetic sensors such as magnetic elements, magnetic layers, non-magnetic layers, magnetic members, conductive members, circuits, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic sensors, and inspection devices practicable by an appropriate design modification by one skilled in the art based on the magnetic sensors, and the inspection devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic sensor, comprising:
   a base body including a base body end portion;
   a magnetic member, a direction from the base body toward the magnetic member being along a first direction; and
   an element part,
   the element part including a first magnetic element and a second magnetic element,
   an orientation from the first magnetic element toward the second magnetic element being along a second direction crossing the first direction,
   a portion of the first magnetic element and a portion of the second magnetic element being between the base body and the magnetic member in the first direction,
   a position in a third direction of an other portion of the first magnetic element and a position in the third direction of an other portion of the second magnetic element being between a position in the third direction of the base body end portion and a position in the third direction of the magnetic member,
   the third direction crossing a plane including the first and second directions.

2. The magnetic sensor according to claim 1, wherein
   the element part further includes a first connection member,
   the first connection member is electrically connected with one of one end portion or an other end portion of the first magnetic element, and
   at least a portion of the first connection member is between the base body and the magnetic member in the first direction.

3. The magnetic sensor according to claim 2, wherein
   the element part further includes a second connection member,
   the second connection member is electrically connected with the other of the one end portion or the other end portion of the first magnetic element, and
   a position in the third direction of the second connection member is between the position in the third direction of the base body end portion and a position in the third direction of at least one of the first magnetic element or the second magnetic element.

4. The magnetic sensor according to claim 3, wherein
   at least a portion of the second magnetic element is between at least a portion of the second connection member in the third direction and at least a portion of the first connection member.

5. The magnetic sensor according to claim 3, wherein
   the element part further includes a conductive member, and
   the conductive member includes:
     a first corresponding portion corresponding to the first magnetic element; and
     a second corresponding portion corresponding to the second magnetic element.

6. The magnetic sensor according to claim 5, wherein
   the other end portion of the first magnetic element is electrically connected with one end portion of the second magnetic element,
   an element current flows between the one end portion of the first magnetic element and an other end portion of the second magnetic element,
   the first corresponding portion includes:
     a first corresponding one-portion corresponding to the one end portion of the first magnetic element; and
     a first corresponding other-portion corresponding to the other end portion of the first magnetic element,
   the second corresponding portion includes:
     a second corresponding one-portion corresponding to the one end portion of the second magnetic element; and
     a second corresponding other-portion corresponding to the other end portion of the second magnetic element,
   at a first time at which a first current that includes an alternating current component is supplied to the conductive member:
     the element current flows through the first magnetic element in an orientation from the one end portion of the first magnetic element toward the other end portion of the first magnetic element;
     the element current flows through the second magnetic element in an orientation from the one end portion of the second magnetic element toward the other end portion of the second magnetic element;
     the first current flows through the first corresponding portion in an orientation from the first corresponding other-portion toward the first corresponding one-portion; and
     the first current flows through the second corresponding portion in an orientation from the second corresponding one-portion toward the second corresponding other-portion.

7. The magnetic sensor according to claim 3, wherein
   the element part further includes a third magnetic element, a fourth magnetic element, and a third connection member,
   an orientation from the first magnetic element toward the third magnetic element is along the second direction,
   an orientation from the first magnetic element toward the fourth magnetic element is along the second direction,
   the third connection member is electrically connected with one of the second magnetic element, the third magnetic element, or the fourth magnetic element, and
   at least a portion of the third connection member is between the base body and the magnetic member in the first direction.

8. The magnetic sensor according to claim 7, wherein
the element part further includes a fourth connection member,
the fourth connection member is electrically connected with one of the second magnetic element, the third magnetic element, or the fourth magnetic element, and
a position in the third direction of the fourth connection member is between the position in the third direction of the base body end portion and a position in the third direction of the one of the second magnetic element, the third magnetic element, or the fourth magnetic element.

9. The magnetic sensor according to claim 7, wherein
the element part further includes a conductive member, and
the conductive member includes:
 a first corresponding portion corresponding to the first magnetic element;
 a second corresponding portion corresponding to the second magnetic element;
 a third corresponding portion corresponding to the third magnetic element; and
 a fourth corresponding portion corresponding to the fourth magnetic element.

10. The magnetic sensor according to claim 9, wherein
the other end portion of the first magnetic element is electrically connected with one end portion of the second magnetic element,
the one end portion of the first magnetic element is electrically connected with one end portion of the third magnetic element,
an other end portion of the third magnetic element is electrically connected with one end portion of the fourth magnetic element,
an other end portion of the second magnetic element is electrically connected with an other end portion of the fourth magnetic element,
the first corresponding portion includes:
 a first corresponding one-portion corresponding to the one end portion of the first magnetic element; and
 a first corresponding other-portion corresponding to the other end portion of the first magnetic element,
the second corresponding portion includes:
 a second corresponding one-portion corresponding to the one end portion of the second magnetic element; and
 a second corresponding other-portion corresponding to the other end portion of the second magnetic element,
the third corresponding portion includes:
 a third corresponding one-portion corresponding to the one end portion of the third magnetic element; and
 a third corresponding other-portion corresponding to the other end portion of the third magnetic element,
the fourth corresponding portion includes:
 a fourth corresponding one-portion corresponding to the one end portion of the fourth magnetic element; and
 a fourth corresponding other-portion corresponding to the other end portion of the fourth magnetic element,
at a first time at which a first current that includes an alternating current component is supplied to the conductive member:
 an element current flows through the first magnetic element in an orientation from the one end portion of the first magnetic element toward the other end portion of the first magnetic element;
 the element current flows through the second magnetic element in an orientation from the one end portion of the second magnetic element toward the other end portion of the second magnetic element;
 the element current flows through the third magnetic element in an orientation from the one end portion of the third magnetic element toward the other end portion of the third magnetic element;
 the element current flows through the fourth magnetic element in an orientation from the one end portion of the fourth magnetic element toward the other end portion of the fourth magnetic element;
 the first current flows through the first corresponding portion in an orientation from the first corresponding other-portion toward the first corresponding one-portion;
 the first current flows through the second corresponding portion in an orientation from the second corresponding one-portion toward the second corresponding other-portion;
 the first current flows through the third corresponding portion in an orientation from the third corresponding one-portion toward the third corresponding other-portion; and
 the first current flows through the fourth corresponding portion in an orientation from the fourth corresponding other-portion toward the fourth corresponding one-portion.

11. The magnetic sensor according to claim 9, wherein
the other end portion of the first magnetic element is electrically connected with one end portion of the second magnetic element,
the one end portion of the first magnetic element is electrically connected with one end portion of the third magnetic element,
an other end portion of the third magnetic element is electrically connected with one end portion of the fourth magnetic element,
an other end portion of the second magnetic element is electrically connected with an other end portion of the fourth magnetic element,
the first corresponding portion includes:
 a first corresponding one-portion corresponding to the one end portion of the first magnetic element; and
 a first corresponding other-portion corresponding to the other end portion of the first magnetic element,
the second corresponding portion includes:
 a second corresponding one-portion corresponding to the one end portion of the second magnetic element; and
 a second corresponding other-portion corresponding to the other end portion of the second magnetic element,
the third corresponding portion includes:
 a third corresponding one-portion corresponding to the one end portion of the third magnetic element; and
 a third corresponding other-portion corresponding to the other end portion of the third magnetic element,
the fourth corresponding portion includes:
 a fourth corresponding one-portion corresponding to the one end portion of the fourth magnetic element; and
 a fourth corresponding other-portion corresponding to the other end portion of the fourth magnetic element,
the first corresponding one-portion is electrically connected with the third corresponding one-portion, the first corresponding other-portion is electrically connected with the second corresponding one-portion, the third corresponding other-portion is electrically connected with the fourth corresponding one-portion, and the second corresponding other-portion is electrically connected with the fourth corresponding other-portion.

12. The magnetic sensor according to claim 11, further comprising:

a first current circuit, the first current circuit being configured to supply the first current between a fifth connection point and a sixth connection point, the first current including an alternating current, the fifth connection point being between the first corresponding other-portion and the second corresponding one-portion, the sixth connection point being between the third corresponding other-portion and the fourth corresponding one-portion.

13. The magnetic sensor according to claim 9, wherein the other end portion of the first magnetic element is electrically connected with one end portion of the second magnetic element, the one end portion of the first magnetic element is electrically connected with one end portion of the third magnetic element, an other end portion of the third magnetic element is electrically connected with one end portion of the fourth magnetic element, an other end portion of the second magnetic element is electrically connected with an other end portion of the fourth magnetic element, the first corresponding portion includes:
 a first corresponding one-portion corresponding to the one end portion of the first magnetic element; and
 a first corresponding other-portion corresponding to the other end portion of the first magnetic element, the second corresponding portion includes:
 a second corresponding one-portion corresponding to the one end portion of the second magnetic element; and
 a second corresponding other-portion corresponding to the other end portion of the second magnetic element, the third corresponding portion includes:
 a third corresponding one-portion corresponding to the one end portion of the third magnetic element; and
 a third corresponding other-portion corresponding to the other end portion of the third magnetic element, the fourth corresponding portion includes:
 a fourth corresponding one-portion corresponding to the one end portion of the fourth magnetic element; and
 a fourth corresponding other-portion corresponding to the other end portion of the fourth magnetic element, the first corresponding one-portion is electrically connected with the second corresponding other-portion, the first corresponding other-portion is electrically connected with the fourth corresponding one-portion, the third corresponding one-portion is electrically connected with the fourth corresponding other-portion, and the third corresponding other-portion is electrically connected with the second corresponding one-portion.

14. The magnetic sensor according to claim 12, further comprising:

a first current circuit, the first current circuit being configured to supply the first current between a seventh connection point and an eighth connection point, the first current including an alternating current, the seventh connection point being between the first corresponding one-portion and the second corresponding other-portion, the eighth connection point being between the third corresponding one-portion and the fourth corresponding other-portion.

15. The magnetic sensor according to claim 9, wherein the other end portion of the first magnetic element is electrically connected with one end portion of the second magnetic element, the one end portion of the first magnetic element is electrically connected with one end portion of the third magnetic element, an other end portion of the third magnetic element is electrically connected with one end portion of the fourth magnetic element, an other end portion of the second magnetic element is electrically connected with an other end portion of the fourth magnetic element, the first corresponding portion includes:
 a first corresponding one-portion corresponding to the one end portion of the first magnetic element; and
 a first corresponding other-portion corresponding to the other end portion of the first magnetic element, the second corresponding portion includes:
 a second corresponding one-portion corresponding to the one end portion of the second magnetic element; and
 a second corresponding other-portion corresponding to the other end portion of the second magnetic element, the third corresponding portion includes:
 a third corresponding one-portion corresponding to the one end portion of the third magnetic element; and
 a third corresponding other-portion corresponding to the other end portion of the third magnetic element, the fourth corresponding portion includes:
 a fourth corresponding one-portion corresponding to the one end portion of the fourth magnetic element; and
 a fourth corresponding other-portion corresponding to the other end portion of the fourth magnetic element, the first corresponding other-portion is electrically connected with the fourth corresponding one-portion, the fourth corresponding other-portion is electrically connected with the second corresponding other-portion, and the second corresponding one-portion is electrically connected with the third corresponding other-portion.

16. The magnetic sensor according to claim 15, further comprising:

a first current circuit, the first current circuit being configured to supply the first current between the first corresponding one-portion and the third corresponding one-portion, the first current including an alternating current.

17. The magnetic sensor according to claim 10, further comprising:
an element current circuit,
the element current circuit being configured to supply an element current between a first connection point and a second connection point,
the first connection point being between the one end portion of the first magnetic element and the one end portion of the third magnetic element,
the second connection point being between the other end portion of the second magnetic element and the other end portion of the fourth magnetic element.

18. The magnetic sensor according to claim 17, further comprising:
a detection circuit,
the detection circuit being configured to detect a change of a potential between a third connection point and a fourth connection point,
the third connection point being between the other end portion of the first magnetic element and the one end portion of the second magnetic element,
the fourth connection point being between the other end portion of the third magnetic element and the one end portion of the fourth magnetic element.

19. The magnetic sensor according to claim 10, wherein a portion of the conductive member overlaps the magnetic member in the first direction.

20. An inspection device, comprising:
the magnetic sensor according to claim 1; and
a processor configured to process a signal output from the magnetic sensor.

* * * * *